(12) United States Patent
Delpapa et al.

(10) Patent No.: US 9,263,156 B2
(45) Date of Patent: Feb. 16, 2016

(54) SYSTEM AND METHOD FOR ADJUSTING TRIP POINTS WITHIN A STORAGE DEVICE

(71) Applicant: SanDisk Enterprise IP LLC, Milpitas, CA (US)

(72) Inventors: Kenneth B. Delpapa, Natick, MA (US); Gregg S. Lucas, Tucson, AZ (US); Robert W. Ellis, Phoenix, AZ (US)

(73) Assignee: SANDISK ENTERPRISE IP LLC, Milpitas, CA (US)

( * ) Notice: Subject to any disclaimer, the term of this patent is extended or adjusted under 35 U.S.C. 154(b) by 158 days.

(21) Appl. No.: 14/135,433

(22) Filed: Dec. 19, 2013

(65) Prior Publication Data
US 2015/0127999 A1 May 7, 2015

Related U.S. Application Data

(60) Provisional application No. 61/901,266, filed on Nov. 7, 2013.

(51) Int. Cl.
*G11C 29/00* (2006.01)
*G11C 29/50* (2006.01)
*G06F 1/28* (2006.01)
*G11C 5/14* (2006.01)

(52) U.S. Cl.
CPC .......... *G11C 29/50004* (2013.01); *G06F 1/28* (2013.01); *G11C 5/143* (2013.01); *G11C 2029/5004* (2013.01)

(58) Field of Classification Search
CPC ............ G11C 29/50004; G11C 5/143; G11C 2029/5004; G06F 1/28
See application file for complete search history.

(56) References Cited

U.S. PATENT DOCUMENTS

| 4,173,737 A | 11/1979 | Skerlos et al. |
| 4,888,750 A | 12/1989 | Kryder et al. |
| 4,916,652 A | 4/1990 | Schwarz et al. |
| 5,129,089 A | 7/1992 | Nielsen |
| 5,270,979 A | 12/1993 | Harari et al. |
| 5,329,491 A | 7/1994 | Brown et al. |
| 5,381,528 A | 1/1995 | Brunelle |
| 5,519,847 A | 5/1996 | Fandrich et al. |
| 5,530,705 A | 6/1996 | Malone, Sr. |

(Continued)

FOREIGN PATENT DOCUMENTS

| EP | 1 299 800 | 4/2003 |
| EP | 1465203 A1 | 10/2004 |

(Continued)

OTHER PUBLICATIONS

Barr, Introduction to Watchdog Timers, Oct. 2001, 3 pgs.

(Continued)

*Primary Examiner* — Sam Rizk
(74) *Attorney, Agent, or Firm* — Morgan, Lewis & Bockius LLP

(57) ABSTRACT

The embodiments described herein include a method and device for adjusting trip points within a storage device. The method includes: obtaining one or more configuration parameters; and based on the one or more configuration parameters, determining a trip voltage. The method also includes comparing the trip voltage with an input voltage. The method further includes triggering a power fail condition in accordance with a determination that the input voltage is less than the trip voltage.

23 Claims, 11 Drawing Sheets

(56) References Cited

U.S. PATENT DOCUMENTS

| | | |
|---|---|---|
| 5,537,555 A | 7/1996 | Landry et al. |
| 5,551,003 A | 8/1996 | Mattson et al. |
| 5,636,342 A | 6/1997 | Jeffries |
| 5,657,332 A | 8/1997 | Auclair et al. |
| 5,666,114 A | 9/1997 | Brodie et al. |
| 5,708,849 A | 1/1998 | Coke et al. |
| 5,765,185 A | 6/1998 | Lambrache et al. |
| 5,890,193 A | 3/1999 | Chevallier |
| 5,936,884 A | 8/1999 | Hasbun et al. |
| 5,943,692 A | 8/1999 | Marberg et al. |
| 5,982,664 A | 11/1999 | Watanabe |
| 6,000,006 A | 12/1999 | Bruce et al. |
| 6,006,345 A | 12/1999 | Berry, Jr. |
| 6,016,560 A | 1/2000 | Wada et al. |
| 6,018,304 A | 1/2000 | Bessios |
| 6,044,472 A | 3/2000 | Crohas |
| 6,070,074 A | 5/2000 | Perahia et al. |
| 6,119,250 A | 9/2000 | Nishimura et al. |
| 6,138,261 A | 10/2000 | Wilcoxson et al. |
| 6,182,264 B1 | 1/2001 | Ott |
| 6,192,092 B1 | 2/2001 | Dizon et al. |
| 6,295,592 B1 | 9/2001 | Jeddeloh |
| 6,311,263 B1 | 10/2001 | Barlow et al. |
| 6,408,394 B1 | 6/2002 | Vander Kamp et al. |
| 6,412,042 B1 | 6/2002 | Paterson et al. |
| 6,442,076 B1 | 8/2002 | Roohparvar |
| 6,449,625 B1 | 9/2002 | Wang |
| 6,484,224 B1 | 11/2002 | Robins et al. |
| 6,516,437 B1 | 2/2003 | Van Stralen et al. |
| 6,564,285 B1 | 5/2003 | Mills et al. |
| 6,678,788 B1 | 1/2004 | O'Connell |
| 6,757,768 B1 | 6/2004 | Potter et al. |
| 6,775,792 B2 | 8/2004 | Ulrich et al. |
| 6,810,440 B2 | 10/2004 | Micalizzi, Jr. et al. |
| 6,836,808 B2 | 12/2004 | Bunce et al. |
| 6,836,815 B1 | 12/2004 | Purcell et al. |
| 6,842,436 B2 | 1/2005 | Moeller |
| 6,865,650 B1 | 3/2005 | Morley et al. |
| 6,871,257 B2 | 3/2005 | Conley et al. |
| 6,895,464 B2 | 5/2005 | Chow et al. |
| 6,966,006 B2 | 11/2005 | Pacheco et al. |
| 6,978,343 B1 | 12/2005 | Ichiriu |
| 6,980,985 B1 | 12/2005 | Amer-Yahia et al. |
| 6,981,205 B2 | 12/2005 | Fukushima et al. |
| 6,988,171 B2 | 1/2006 | Beardsley et al. |
| 7,020,017 B2 | 3/2006 | Chen et al. |
| 7,028,165 B2 | 4/2006 | Roth et al. |
| 7,032,123 B2 | 4/2006 | Kane et al. |
| 7,043,505 B1 | 5/2006 | Teague et al. |
| 7,076,598 B2 | 7/2006 | Wang |
| 7,100,002 B2 | 8/2006 | Shrader |
| 7,102,860 B2 | 9/2006 | Wenzel |
| 7,111,293 B1 | 9/2006 | Hersh et al. |
| 7,126,873 B2 | 10/2006 | See et al. |
| 7,133,282 B2 | 11/2006 | Sone |
| 7,162,678 B2 | 1/2007 | Saliba |
| 7,173,852 B2 | 2/2007 | Gorobets et al. |
| 7,184,446 B2 | 2/2007 | Rashid et al. |
| 7,275,170 B2 | 9/2007 | Suzuki |
| 7,328,377 B1 | 2/2008 | Lewis et al. |
| 7,516,292 B2 | 4/2009 | Kimura et al. |
| 7,523,157 B2 | 4/2009 | Aguilar, Jr. et al. |
| 7,527,466 B2 | 5/2009 | Simmons |
| 7,529,466 B2 | 5/2009 | Takahashi |
| 7,533,214 B2 | 5/2009 | Aasheim et al. |
| 7,546,478 B2 | 6/2009 | Kubo et al. |
| 7,566,987 B2 | 7/2009 | Black et al. |
| 7,571,277 B2 | 8/2009 | Mizushima |
| 7,574,554 B2 | 8/2009 | Tanaka et al. |
| 7,596,643 B2 | 9/2009 | Merry, Jr. et al. |
| 7,681,106 B2 | 3/2010 | Jarrar et al. |
| 7,685,494 B1 | 3/2010 | Varnica et al. |
| 7,707,481 B2 | 4/2010 | Kirschner et al. |
| 7,761,655 B2 | 7/2010 | Mizushima et al. |
| 7,765,454 B2 | 7/2010 | Passint |
| 7,774,390 B2 | 8/2010 | Shin |
| 7,840,762 B2 | 11/2010 | Oh et al. |
| 7,870,326 B2 | 1/2011 | Shin et al. |
| 7,890,818 B2 | 2/2011 | Kong et al. |
| 7,913,022 B1 | 3/2011 | Baxter |
| 7,925,960 B2 | 4/2011 | Ho et al. |
| 7,934,052 B2 | 4/2011 | Prins et al. |
| 7,945,825 B2 | 5/2011 | Cohen et al. |
| 7,954,041 B2 | 5/2011 | Hong et al. |
| 7,971,112 B2 | 6/2011 | Murata |
| 7,974,368 B2 | 7/2011 | Shieh et al. |
| 7,978,516 B2 | 7/2011 | Olbrich et al. |
| 7,996,642 B1 | 8/2011 | Smith |
| 8,006,161 B2 | 8/2011 | Lestable et al. |
| 8,032,724 B1 | 10/2011 | Smith |
| 8,041,884 B2 | 10/2011 | Chang |
| 8,042,011 B2 | 10/2011 | Nicolaidis et al. |
| 8,069,390 B2 | 11/2011 | Lin |
| 8,190,967 B2 | 5/2012 | Hong et al. |
| 8,250,380 B2 | 8/2012 | Guyot |
| 8,254,181 B2 | 8/2012 | Hwang et al. |
| 8,259,506 B1 | 9/2012 | Sommer et al. |
| 8,312,349 B2 | 11/2012 | Reche et al. |
| 8,412,985 B1 | 4/2013 | Bowers et al. |
| 8,429,436 B2 | 4/2013 | Fillingim et al. |
| 8,438,459 B2 | 5/2013 | Cho et al. |
| 8,453,022 B2 | 5/2013 | Katz |
| 8,627,117 B2 | 1/2014 | Johnston |
| 8,634,248 B1 | 1/2014 | Sprouse et al. |
| 8,694,854 B1 | 4/2014 | Dar et al. |
| 8,724,789 B2 | 5/2014 | Altberg et al. |
| 8,885,434 B2 | 11/2014 | Kumar |
| 8,898,373 B1 | 11/2014 | Kang et al. |
| 8,910,030 B2 | 12/2014 | Goel |
| 8,923,066 B1 | 12/2014 | Subramanian et al. |
| 9,128,690 B2 | 9/2015 | Lotzenburger et al. |
| 2001/0050824 A1 | 12/2001 | Buch |
| 2002/0024846 A1 | 2/2002 | Kawahara et al. |
| 2002/0036515 A1 | 3/2002 | Eldridge et al. |
| 2002/0083299 A1 | 6/2002 | Van Huben et al. |
| 2002/0122334 A1 | 9/2002 | Lee et al. |
| 2002/0152305 A1 | 10/2002 | Jackson et al. |
| 2002/0162075 A1 | 10/2002 | Talagala et al. |
| 2002/0165896 A1 | 11/2002 | Kim |
| 2003/0041299 A1 | 2/2003 | Kanazawa et al. |
| 2003/0043829 A1 | 3/2003 | Rashid et al. |
| 2003/0088805 A1 | 5/2003 | Majni et al. |
| 2003/0093628 A1 | 5/2003 | Matter et al. |
| 2003/0163594 A1 | 8/2003 | Aasheim et al. |
| 2003/0163629 A1 | 8/2003 | Conley et al. |
| 2003/0188045 A1 | 10/2003 | Jacobson |
| 2003/0189856 A1 | 10/2003 | Cho et al. |
| 2003/0198100 A1 | 10/2003 | Matsushita et al. |
| 2003/0204341 A1* | 10/2003 | Guliani et al. ................. 702/60 |
| 2003/0212719 A1 | 11/2003 | Yasuda et al. |
| 2004/0024957 A1 | 2/2004 | Lin et al. |
| 2004/0024963 A1 | 2/2004 | Talagala et al. |
| 2004/0057575 A1 | 3/2004 | Zhang et al. |
| 2004/0062157 A1 | 4/2004 | Kawabe |
| 2004/0073829 A1 | 4/2004 | Olarig |
| 2004/0114265 A1 | 6/2004 | Talbert |
| 2004/0143710 A1 | 7/2004 | Walmsley |
| 2004/0148561 A1 | 7/2004 | Shen et al. |
| 2004/0153902 A1 | 8/2004 | Machado et al. |
| 2004/0167898 A1 | 8/2004 | Margolus et al. |
| 2004/0181734 A1 | 9/2004 | Saliba |
| 2004/0199714 A1 | 10/2004 | Estakhri et al. |
| 2004/0237018 A1 | 11/2004 | Riley |
| 2005/0060456 A1 | 3/2005 | Shrader et al. |
| 2005/0060501 A1 | 3/2005 | Shrader |
| 2005/0073884 A1 | 4/2005 | Gonzalez et al. |
| 2005/0108588 A1 | 5/2005 | Yuan |
| 2005/0114587 A1 | 5/2005 | Chou et al. |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0231765 A1 | 10/2005 | So et al. |
| 2005/0249013 A1 | 11/2005 | Janzen et al. |

(56) References Cited

U.S. PATENT DOCUMENTS

| | | |
|---|---|---|
| 2005/0251617 A1 | 11/2005 | Sinclair et al. |
| 2005/0257120 A1 | 11/2005 | Gorobets et al. |
| 2005/0273560 A1 | 12/2005 | Hulbert et al. |
| 2005/0289314 A1 | 12/2005 | Adusumilli et al. |
| 2006/0010174 A1 | 1/2006 | Nguyen et al. |
| 2006/0039196 A1 | 2/2006 | Gorobets et al. |
| 2006/0039227 A1 | 2/2006 | Lai et al. |
| 2006/0053246 A1 | 3/2006 | Lee |
| 2006/0085671 A1 | 4/2006 | Majni et al. |
| 2006/0087893 A1 | 4/2006 | Nishihara et al. |
| 2006/0107181 A1 | 5/2006 | Dave et al. |
| 2006/0136570 A1 | 6/2006 | Pandya |
| 2006/0136681 A1 | 6/2006 | Jain et al. |
| 2006/0156177 A1 | 7/2006 | Kottapalli et al. |
| 2006/0195650 A1 | 8/2006 | Su et al. |
| 2006/0244049 A1 | 11/2006 | Yaoi et al. |
| 2006/0259528 A1 | 11/2006 | Dussud et al. |
| 2006/0291301 A1 | 12/2006 | Ziegelmayer |
| 2007/0011413 A1 | 1/2007 | Nonaka et al. |
| 2007/0058446 A1 | 3/2007 | Hwang et al. |
| 2007/0061597 A1 | 3/2007 | Holtzman et al. |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0088716 A1 | 4/2007 | Brumme et al. |
| 2007/0091677 A1 | 4/2007 | Lasser et al. |
| 2007/0113019 A1 | 5/2007 | Beukema et al. |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0156842 A1 | 7/2007 | Vermeulen et al. |
| 2007/0157064 A1 | 7/2007 | Falik et al. |
| 2007/0174579 A1 | 7/2007 | Shin |
| 2007/0180188 A1 | 8/2007 | Fujibayashi et al. |
| 2007/0180346 A1 | 8/2007 | Murin |
| 2007/0201274 A1 | 8/2007 | Yu et al. |
| 2007/0208901 A1 | 9/2007 | Purcell et al. |
| 2007/0234143 A1 | 10/2007 | Kim |
| 2007/0245061 A1 | 10/2007 | Harriman |
| 2007/0245099 A1 | 10/2007 | Gray et al. |
| 2007/0263442 A1 | 11/2007 | Cornwall et al. |
| 2007/0277036 A1 | 11/2007 | Chamberlain et al. |
| 2007/0279988 A1 | 12/2007 | Nguyen |
| 2007/0291556 A1 | 12/2007 | Kamei |
| 2007/0294496 A1 | 12/2007 | Goss et al. |
| 2007/0300130 A1 | 12/2007 | Gorobets |
| 2008/0013390 A1 | 1/2008 | Zipprich-Rasch |
| 2008/0019182 A1 | 1/2008 | Yanagidaira et al. |
| 2008/0022163 A1 | 1/2008 | Tanaka et al. |
| 2008/0028275 A1 | 1/2008 | Chen et al. |
| 2008/0043871 A1 | 2/2008 | Latouche et al. |
| 2008/0052446 A1 | 2/2008 | Lasser et al. |
| 2008/0056005 A1 | 3/2008 | Aritome |
| 2008/0071971 A1 | 3/2008 | Kim et al. |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0112226 A1 | 5/2008 | Mokhlesi |
| 2008/0141043 A1 | 6/2008 | Flynn et al. |
| 2008/0144371 A1 | 6/2008 | Yeh et al. |
| 2008/0147714 A1 | 6/2008 | Breternitz et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0313132 A1 | 12/2008 | Hao et al. |
| 2009/0003058 A1 | 1/2009 | Kang |
| 2009/0019216 A1 | 1/2009 | Yamada et al. |
| 2009/0031083 A1 | 1/2009 | Willis et al. |
| 2009/0037652 A1 | 2/2009 | Yu et al. |
| 2009/0070608 A1 | 3/2009 | Kobayashi |
| 2009/0116283 A1 | 5/2009 | Ha et al. |
| 2009/0125671 A1 | 5/2009 | Flynn et al. |
| 2009/0144598 A1 | 6/2009 | Yoon et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0207660 A1 | 8/2009 | Hwang et al. |
| 2009/0213649 A1 | 8/2009 | Takahashi et al. |
| 2009/0222708 A1 | 9/2009 | Yamaga |
| 2009/0228761 A1 | 9/2009 | Perlmutter et al. |
| 2009/0249160 A1 | 10/2009 | Gao et al. |
| 2009/0268521 A1 | 10/2009 | Ueno et al. |
| 2009/0292972 A1 | 11/2009 | Seol et al. |
| 2009/0296466 A1 | 12/2009 | Kim et al. |
| 2009/0296486 A1 | 12/2009 | Kim et al. |
| 2009/0310422 A1 | 12/2009 | Edahiro et al. |
| 2009/0319864 A1 | 12/2009 | Shrader |
| 2010/0002506 A1 | 1/2010 | Cho et al. |
| 2010/0008175 A1 | 1/2010 | Sweere et al. |
| 2010/0011261 A1 | 1/2010 | Cagno et al. |
| 2010/0020620 A1 | 1/2010 | Kim et al. |
| 2010/0037012 A1 | 2/2010 | Yano et al. |
| 2010/0061151 A1 | 3/2010 | Miwa et al. |
| 2010/0091535 A1 | 4/2010 | Sommer et al. |
| 2010/0103737 A1 | 4/2010 | Park |
| 2010/0110798 A1 | 5/2010 | Hoei et al. |
| 2010/0118608 A1 | 5/2010 | Song et al. |
| 2010/0138592 A1 | 6/2010 | Cheon |
| 2010/0153616 A1 | 6/2010 | Garratt |
| 2010/0161936 A1 | 6/2010 | Royer et al. |
| 2010/0174959 A1 | 7/2010 | No et al. |
| 2010/0199125 A1 | 8/2010 | Reche |
| 2010/0199138 A1 | 8/2010 | Rho |
| 2010/0202196 A1 | 8/2010 | Lee et al. |
| 2010/0208521 A1 | 8/2010 | Kim et al. |
| 2010/0262889 A1 | 10/2010 | Bains |
| 2010/0281207 A1 | 11/2010 | Miller et al. |
| 2010/0281342 A1 | 11/2010 | Chang et al. |
| 2010/0332858 A1 | 12/2010 | Trantham et al. |
| 2011/0010514 A1 | 1/2011 | Benhase et al. |
| 2011/0051513 A1 | 3/2011 | Shen et al. |
| 2011/0066597 A1 | 3/2011 | Mashtizadeh et al. |
| 2011/0078407 A1 | 3/2011 | Lewis |
| 2011/0083060 A1 | 4/2011 | Sakurada et al. |
| 2011/0099460 A1 | 4/2011 | Dusija et al. |
| 2011/0113281 A1 | 5/2011 | Zhang et al. |
| 2011/0122691 A1 | 5/2011 | Sprouse |
| 2011/0131444 A1 | 6/2011 | Buch et al. |
| 2011/0173378 A1 | 7/2011 | Filor et al. |
| 2011/0179249 A1 | 7/2011 | Hsiao |
| 2011/0199825 A1 | 8/2011 | Han et al. |
| 2011/0205823 A1 | 8/2011 | Hemink et al. |
| 2011/0213920 A1 | 9/2011 | Frost et al. |
| 2011/0222342 A1 | 9/2011 | Yoon et al. |
| 2011/0225346 A1 | 9/2011 | Goss et al. |
| 2011/0228601 A1 | 9/2011 | Olbrich et al. |
| 2011/0231600 A1 | 9/2011 | Tanaka et al. |
| 2011/0264843 A1 | 10/2011 | Haines et al. |
| 2011/0271040 A1 | 11/2011 | Kamizono |
| 2011/0283119 A1 | 11/2011 | Szu et al. |
| 2012/0023144 A1 | 1/2012 | Rub |
| 2012/0054414 A1 | 3/2012 | Tsai et al. |
| 2012/0063234 A1 | 3/2012 | Shiga et al. |
| 2012/0072639 A1 | 3/2012 | Goss et al. |
| 2012/0096217 A1 | 4/2012 | Son et al. |
| 2012/0110250 A1 | 5/2012 | Sabbag et al. |
| 2012/0151124 A1 | 6/2012 | Baek et al. |

(56) References Cited

U.S. PATENT DOCUMENTS

| | | |
|---|---|---|
| 2012/0151253 A1 | 6/2012 | Horn |
| 2012/0151294 A1 | 6/2012 | Yoo et al. |
| 2012/0173797 A1 | 7/2012 | Shen |
| 2012/0185750 A1 | 7/2012 | Hayami |
| 2012/0195126 A1 | 8/2012 | Roohparvar |
| 2012/0203951 A1 | 8/2012 | Wood et al. |
| 2012/0216079 A1 | 8/2012 | Fai et al. |
| 2012/0233391 A1 | 9/2012 | Frost et al. |
| 2012/0236658 A1 | 9/2012 | Byom et al. |
| 2012/0239858 A1 | 9/2012 | Melik-Martirosian |
| 2012/0239976 A1 | 9/2012 | Cometti et al. |
| 2012/0259863 A1 | 10/2012 | Bodwin et al. |
| 2012/0275466 A1 | 11/2012 | Bhadra et al. |
| 2012/0278564 A1 | 11/2012 | Goss et al. |
| 2012/0284574 A1 | 11/2012 | Avila et al. |
| 2012/0284587 A1 | 11/2012 | Yu et al. |
| 2013/0007073 A1 | 1/2013 | Varma |
| 2013/0007343 A1 | 1/2013 | Rub et al. |
| 2013/0007543 A1 | 1/2013 | Goss et al. |
| 2013/0024735 A1 | 1/2013 | Chung et al. |
| 2013/0031438 A1 | 1/2013 | Hu et al. |
| 2013/0036418 A1 | 2/2013 | Yadappanavar et al. |
| 2013/0047045 A1 | 2/2013 | Hu et al. |
| 2013/0073924 A1 | 3/2013 | D'Abreu et al. |
| 2013/0079942 A1 | 3/2013 | Smola et al. |
| 2013/0086131 A1 | 4/2013 | Hunt et al. |
| 2013/0086132 A1 | 4/2013 | Hunt et al. |
| 2013/0094288 A1 | 4/2013 | Patapoutian et al. |
| 2013/0111279 A1 | 5/2013 | Jeon et al. |
| 2013/0111298 A1 | 5/2013 | Seroff et al. |
| 2013/0121084 A1 | 5/2013 | Jeon et al. |
| 2013/0124888 A1 | 5/2013 | Tanaka et al. |
| 2013/0128666 A1 | 5/2013 | Avila et al. |
| 2013/0132652 A1 | 5/2013 | Wood et al. |
| 2013/0176784 A1 | 7/2013 | Cometti et al. |
| 2013/0179646 A1 | 7/2013 | Okubo et al. |
| 2013/0191601 A1 | 7/2013 | Peterson et al. |
| 2013/0194874 A1 | 8/2013 | Mu et al. |
| 2013/0232289 A1 | 9/2013 | Zhong et al. |
| 2013/0258738 A1 | 10/2013 | Barkon et al. |
| 2013/0265838 A1 | 10/2013 | Li |
| 2013/0282955 A1 | 10/2013 | Parker et al. |
| 2013/0290611 A1 | 10/2013 | Biederman et al. |
| 2013/0301373 A1 | 11/2013 | Tam |
| 2013/0304980 A1 | 11/2013 | Nachimuthu et al. |
| 2013/0343131 A1 | 12/2013 | Wu et al. |
| 2014/0013188 A1 | 1/2014 | Wu et al. |
| 2014/0063905 A1 | 3/2014 | Ahn et al. |
| 2014/0075133 A1 | 3/2014 | Li et al. |
| 2014/0082261 A1 | 3/2014 | Cohen et al. |
| 2014/0082456 A1 | 3/2014 | Liu |
| 2014/0095775 A1 | 4/2014 | Talagala et al. |
| 2014/0122818 A1 | 5/2014 | Hayasaka et al. |
| 2014/0136883 A1 | 5/2014 | Cohen |
| 2014/0136927 A1 | 5/2014 | Li et al. |
| 2014/0143505 A1 | 5/2014 | Sim et al. |
| 2014/0201596 A1 | 7/2014 | Baum et al. |
| 2014/0223084 A1 | 8/2014 | Lee et al. |
| 2014/0258755 A1 | 9/2014 | Stenfort |
| 2014/0269090 A1 | 9/2014 | Flynn et al. |
| 2014/0359381 A1 | 12/2014 | Takeuchi et al. |
| 2015/0153799 A1 | 6/2015 | Lucas et al. |

FOREIGN PATENT DOCUMENTS

| | | |
|---|---|---|
| EP | 1 990 921 A2 | 11/2008 |
| EP | 2 386 958 A1 | 11/2011 |
| EP | 2 620 946 A2 | 7/2013 |
| JP | 2002-532806 S | 10/2002 |
| WO | WO 2007/036834 A2 | 4/2007 |
| WO | WO 2007/080586 A2 | 7/2007 |
| WO | WO 2008/075292 | 6/2008 |
| WO | WO 2008/121553 A1 | 10/2008 |
| WO | WO 2008/121577 A1 | 10/2008 |
| WO | WO 2009/028281 A1 | 3/2009 |
| WO | WO 2009/032945 A1 | 3/2009 |
| WO | WO 2009/058140 A1 | 5/2009 |
| WO | WO 2009/084724 | 7/2009 |
| WO | WO 2009/134576 A1 | 11/2009 |
| WO | WO 2011/024015 | 3/2011 |

OTHER PUBLICATIONS

Canim, Buffered Bloom ilters on Solid State Storage, ADMS*10, Singapore, Sep. 13-17, 2010, 8 pgs.
Kang, A Multi-Channel Architecture for High-Performance NAND Flash-Based Storage System, J. Syst. Archit., 53, 9, Sep. 2007, 15 pgs.
Kim, A Space-Efficient Flash Translation Layer for CompactFlash Systems, May 2002, 10 pgs.
Lu, A Forest-structured Bloom Filter with Flash Memory, MSST 2011, Denver, CO, May 23-27, 2011, article, 6 pgs.
Lu, A Forest-structured Bloom Filter with Flash Memory, MSST 2011, Denver, CO, May 23-27, 2011, presentation slides, 25 pgs.
McLean, Information Technology—AT Attachment with Packet Interface Extension, Aug. 19, 1998, 339 pgs.
Park, A High Performance Controller for NAND Flash-Based Solid State Disk (NSSD), Feb. 12-16, 2006, 4 pgs.
Pliant Technology, International Search Report / Written Opinion, PCT/US08/88133, Mar. 19, 2009, 7 pgs.
Pliant Technology, International Search Report / Written Opinion, PCT/US08/88136, Mar. 19, 2009, 7 pgs.
Pliant Technology, International Search Report / Written Opinion, PCT/US08/88146, Feb. 26, 2009, 10 pgs.
Pliant Technology, International Search Report / Written Opinion, PCT/US08/88154, Feb. 27, 2009, 8 pgs.
Pliant Technology, International Search Report / Written Opinion, PCT/US08/88164, Feb. 13, 2009, 6 pgs.
Pliant Technology, International Search Report / Written Opinion, PCT/US08/88206, Feb. 18, 2009, 8 pgs.
Pliant Technology, International Search Report / Written Opinion, PCT/US08/88217, Feb. 19, 2009, 7 pgs.
Pliant Technology, International Search Report / Written Opinion, PCT/US08/88229, Feb. 13, 2009, 7 pgs.
Pliant Technology, International Search Report / Written Opinion, PCT/US08/88232, Feb. 19, 2009, 8 pgs.
Pliant Technology, International Search Report / Written Opinion, PCT/US08/88236, Feb. 19, 2009, 7 pgs.
Pliant Technology, International Search Report / Written Opinion, PCT/US2011/028637, Oct. 27, 2011, 11 pgs.
Pliant Technology, Supplementary ESR, 08866997.3, Feb. 23, 2012, 6 pgs.
SanDisk Enterprise IP LLC, International Search Report / Written Opinion, PCT/US2012/042764, Aug. 31, 2012, 12 pgs.
SanDisk Enterprise IP LLC, International Search Report / Written Opinion, PCT/US2012/042771, Mar. 4, 2013, 14 pgs.
SanDisk Enterprise IP LLC, International Search Report / Written Opinion, PCT/US2012/042775, Sep. 26, 2012, 8 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
Sandisk Enterprise IP LLC, International Search Report / Written Opinion, PCT/US2012/059459, Feb. 14, 2013, 9 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jul. 4, 2013, 1 pg.
SanDisk Enterprise IP LLC, Office Action, CN 200880127623.8, Apr. 18, 2012, 12 pgs.
SanDisk Enterprise IP LLC, Office Action, CN 200880127623.8, Dec. 31, 2012, 9 pgs.

(56) References Cited

OTHER PUBLICATIONS

SanDisk Enterprise IP LLC, Office Action, JP 2010-540863, Jul. 24, 2012, 3 pgs.
Watchdog Timer and Power Savin Modes, Microchip Technology Inc., 2005, 14 pgs.
Zeidman, 1999 Verilog Designer's Library, 9 pgs.
Invitation to Pay Additional Fees dated Feb. 13, 2015, received in International Patent Application No. PCT/US2014/063949, which corresponds to U.S. Appl. No. 14/135,433, 6 pages (Delpapa).
International Search Report and Written Opinion dated Jan. 21, 2015, received in International Application No. PCT/US2014/059746, which corresponds to U.S. Appl. No. 14/137,511, 13 pages (Dancho).
International Search Report and Written Opinion dated Feb. 18, 2015, received in International Appication No. PCT/US2014/066921, which corresponds to U.S. Appl. No. 14/135,260, 13 pages (Fitzpatrick).
Ashkenazi et al., "Platform independent overall security architecture in multi-processor system-on-chip integrated circuits for use in mobile phones and handheld devices," ScienceDirect, Computers and Electrical Engineering 33 (2007), 18 pages.
Lee et al., "A Semi-Preemptive Garbage Collector for Solid State Drives," Apr. 2011, IEEE, pp. 12-21.
Office Action dated Feb. 17, 2015, received in Chinese Patent Application No. 201210334987.1, which corresponds to U.S. Appl. No. 12/082,207, 9 pages (Prins).
International Search Report and Written Opinion dated May 4, 2015, received in International Patent Application No. PCT/US2014/065987, which corresponds to U.S. Appl. No. 14/135,400, 12 pages (George).
International Search Report and Written Opinion dated Mar. 17, 2015, received in International Patent Application No. PCT/US2014/067467, which corresponds to U.S. Appl. No. 14/135,420, 13 pages (Lucas).
International Search Report and Written Opinion dated Apr. 20, 2015, received in International Patent Application No. PCT/US2014/063949, which corresponds to U.S. Appl. No. 14/135,433, 21 pages (Delpapa).
International Search Report and Written Opinion dated Mar. 9, 2015, received in International Patent Application No. PCT/US2014/059747, which corresponds to U.S. Appl. No. 14/137,440, 9 pages (Fitzpatrick).
International Search Report and Written Opinion dated Jul. 25, 2014, received in International Patent Application No. PCT/US2014/029453, which corresponds to U.S. Appl. No. 13/963,444, 9 pages (Frayer).
International Search Report and Written Opinion dated Mar. 7, 2014, received in International Patent Application No. PCT/US2013/074772, which corresponds to U.S. Appl. No. 13/831,218, 10 pages (George).
International Search Report and Written Opinion dated Mar. 24, 2014, received in International Patent Application No. PCT/US2013/074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).
Bayer, "Prefix B-Trees", IP.COM Journal, IP.COM Inc., West Henrietta, NY, Mar. 30, 2007, 29 pages.
Bhattacharjee et al., "Efficient Index Compression in DB2 LUW", IBM Research Report, Jun. 23, 2009, http://domino.research.ibm.com/library/cyberdig.nsf/papers/40B2C45876D0D747852575E100620CE7/$File/rc24815.pdf, 13 pages.
Oracle, "Oracle9i: Database Concepts", Jul. 2001, http://docs.oracle.com/cd/A91202_01/901_doc/server.901/288856.pdf, 49 pages.
International Search Report and Written Opinion dated Jun. 8, 2015, received in International Patent Application No. PCT/US2015/018252, which corresponds to U.S. Appl. No. 14/339,072, 9 pages (Busch).
International Search Report and Written Opinion dated Jun. 2, 2015, received in International Patent Application No. PCT/US2015/018255, which corresponds to U.S. Appl. No. 14/336,967, 14 pages (Chander).
International Search Report and Written Opinion dated Jun. 30, 2015, received in International Patent Application No. PCT/US2015/023927, which corresponds to U.S. Appl. No. 14/454,687, 11 pages (Kadayam).
International Search Report and Written Opinion dated Jul. 23, 2015, received in International Patent Application No. PCT/US2015/030850, which corresponds to U.S. Appl. No. 14/298,843, 12 pages (Ellis).
Office Action dated Dec. 8, 2014, received in Chinese Patent Application No. 201180021660.2, which corresponds to U.S. Appl. No. 12/726,200, 7 pages (Olbrich).
Office Action dated Jul. 31, 2015, received in Chinese Patent Application No. 201180021660.2, which corresponds to U.S. Appl. No. 12/726,200, 9 pages (Olbrich).
International Search Report and Written Opinion dated Sep. 14, 2015, received in International Patent Application No. PCT/US2015/036807, which corresponds to U.S. Appl. No. 14/311,152, 9 pages (Higgins).

\* cited by examiner

SYSTEM AND METHOD FOR ADJUSTING TRIP POINTS WITHIN A STORAGE DEVICE

RELATED APPLICATIONS

This application claims priority to U.S. Provisional Patent Application No. 61/901,266, filed Nov. 7, 2013, which is hereby incorporated by reference in its entirety.

TECHNICAL FIELD

The disclosed embodiments relate generally to memory systems, and in particular, to adjusting trip points in a storage device.

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data storage device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information.

SUMMARY

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to adjust trip points for triggering a power fail process based on one or more configuration parameters (e.g., input or supply voltage) of a data storage device.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
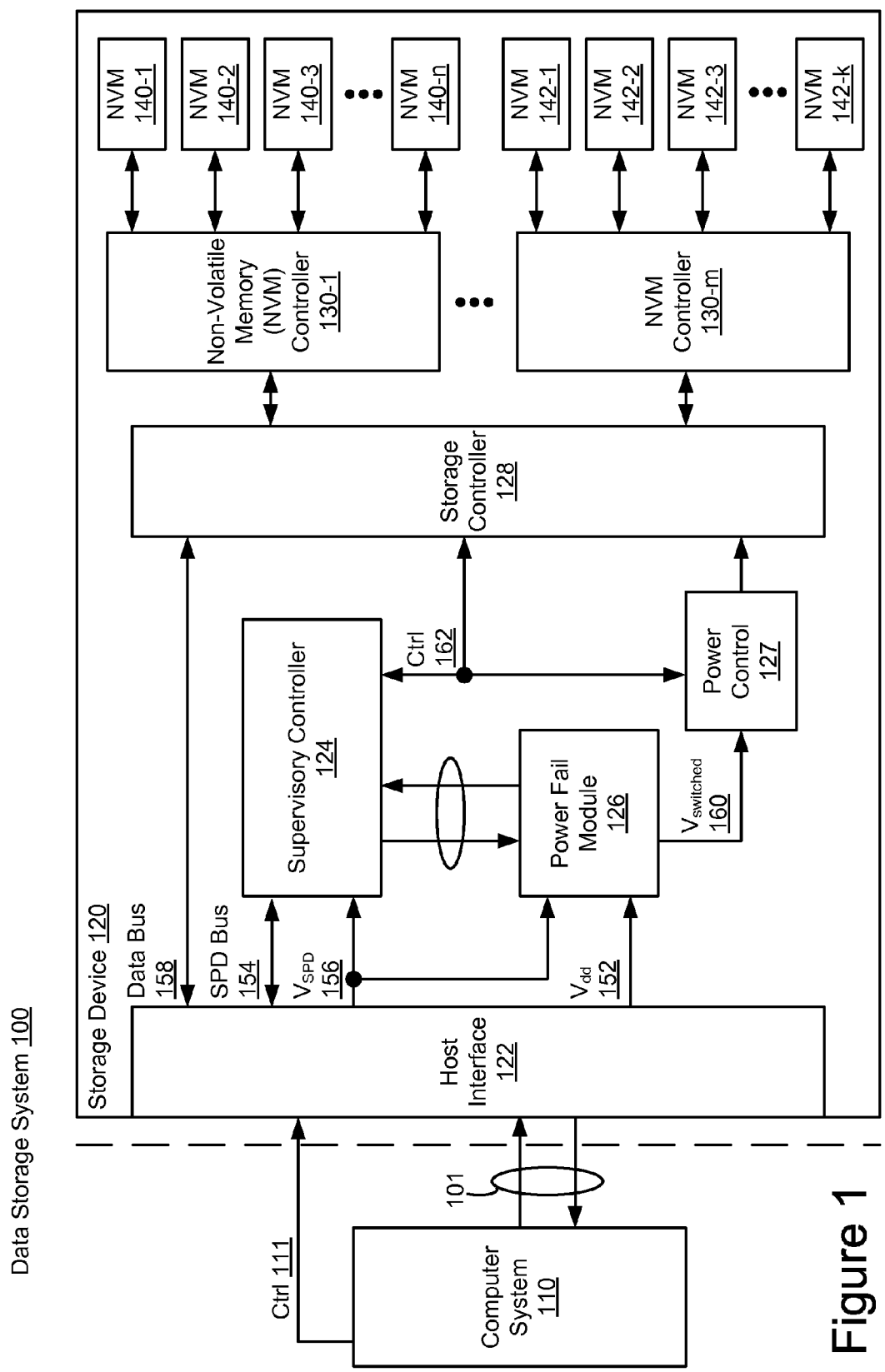
FIG. 1 is a block diagram illustrating an implementation of a data storage system in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices for adjusting trip points that trigger a power fail process based on one or more configuration parameters of a storage device. For example, in accordance with some embodiments, in a storage device configured to be compatible with an interface standard (e.g., DDR3) that allows a host system to provide one of a plurality of supply voltages to the storage device, the storage device is configured to adjust trip points that trigger a power fail process in accordance with the supply voltage(s) provided by the host system.

More specifically, some embodiments include a method of adjusting trip points in a storage device. In some embodiments, the method is performed within a storage device operatively coupled with a host system. The method includes: obtaining one or more configuration parameters; and based on the one or more configuration parameters, determining a trip voltage. The method also includes comparing the trip voltage with an input voltage. The method further includes triggering a power fail condition in accordance with a determination that the input voltage is less than the trip voltage (or, in some circumstances, greater than the trip voltage).

Some embodiments include a storage device comprising: a host interface configured to couple the storage device with a host system; a supervisory controller with one or more processors and memory; a power fail module for detecting a power fail condition; and a plurality of controller for managing one or more non-volatile memory devices. The storage device is configured to perform the operations of any of the methods described herein.

Some embodiments include a storage device comprising: a host interface configured to couple the storage device with a host system; and means for performing the operations of any of the methods described herein.

Some embodiments include a non-transitory computer readable storage medium, storing one or more programs for execution by one or more processors of a storage device, the one or more programs including instructions for performing the operations any of the methods described herein.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 is a block diagram illustrating an implementation of data storage system 100 in accordance with some embodiments. While some example features are illustrated, various other features have not been illustrated for the sake of brevity and so as not to obscure more pertinent aspects of the example implementations disclosed herein. To that end, as a non-limiting example, data storage system 100 includes storage device 120, which includes host interface 122, supervisory controller 124, power fail module 126, power control 127, storage controller 128 (sometimes called a memory controller), one or more non-volatile memory (NVM) controllers 130 (e.g., NVM controller 130-1 through NVM controller 130-m), and non-volatile memory (NVM) (e.g., one or more NVM device(s) 140, 142 such as one or more flash memory devices), and is used in conjunction with computer system 110.

Computer system 110 is coupled with storage device 120 through data connections 101. However, in some embodiments, computer system 110 includes storage device 120 as a component and/or sub-system. Computer system 110 may be any suitable computing device, such as a personal computer, a workstation, a computer server, or any other computing device. Computer system 110 is sometimes called a host or host system. In some embodiments, computer system 110 includes one or more processors, one or more types of memory, optionally includes a display and/or other user interface components such as a keyboard, a touch screen display, a mouse, a track-pad, a digital camera and/or any number of supplemental devices to add functionality. Further, in some embodiments, computer system 110 sends one or more host commands (e.g., read commands and/or write commands) on control line 111 to storage device 120. In some embodiments, computer system 110 is a server system, such as a server system in a data center, and does not have a display and other user interface components.

In some embodiments, storage device 120 includes a single NVM device while in other implementations storage device 120 includes a plurality of NVM devices. In some embodiments, NVM devices 140, 142 include NAND-type flash memory or NOR-type flash memory. Further, in some embodiments, NVM controller 130 is a solid-state drive (SSD) controller. However, one or more other types of storage media may be included in accordance with aspects of a wide variety of implementations. In some embodiments, storage device 120 is or includes a dual in-line memory module (DIMM) device. In some embodiments, storage device 120 is compatible with a DIMM memory slot. For example, storage device 120 is compatible with a 240-pin DIMM memory slot and is compatible with signaling in accordance with a DDR3 interface specification.

In some embodiments, storage device 120 includes NVM devices 140, 142 (e.g., NVM devices 140-1 through 140-n and NVM devices 142-1 through 142-k) and NVM controllers 130 (e.g., NVM controllers 130-1 through 130-m). In some embodiments, each NVM controller of NVM controllers 130 include one or more processing units (sometimes called CPUs or processors) configured to execute instructions in one or more programs (e.g., in NVM controllers 130). In some embodiments, the one or more processors are shared by one or more components within, and in some cases, beyond the function of NVM controllers 130. NVM devices 140, 142 are coupled with NVM controllers 130 through connections that typically convey commands in addition to data, and, optionally, convey metadata, error correction information and/or other information in addition to data values to be stored in NVM devices 140, 142 and data values read from NVM devices 140, 142. For example, NVM devices 140, 142 can be configured for enterprise storage suitable for applications such as cloud computing, or for caching data stored (or to be stored) in secondary storage, such as hard disk drives. Additionally and/or alternatively, flash memory (e.g., NVM devices 140, 142) can also be configured for relatively smaller-scale applications such as personal flash drives or hard-disk replacements for personal, laptop and tablet computers. Although flash memory devices and flash controllers are used as an example here, in some embodiments storage device 120 includes other non-volatile memory device(s) and corresponding non-volatile storage controller(s).

In some embodiments, storage device 120 also includes host interface 122, supervisory controller 124, power fail module 126, power control 127, and storage controller 128. Storage device 120 may include various additional features that have not been illustrated for the sake of brevity and so as not to obscure more pertinent features of the example implementations disclosed herein, and a different arrangement of features may be possible. Host interface 122 provides an interface to computer system 110 through data connections 101.

Supervisory controller 124 is coupled with host interface 122, power fail module 126, power control 127, storage controller 128, and NVM controllers 130 (connection not shown) in order to coordinate the operation of these components, including supervising and controlling functions such as power up, power down, data hardening, charging energy storage device(s), data logging, and other aspects of managing functions on storage device 120. Supervisory controller 124 is coupled with host interface 122 via serial presence detect (SPD) bus 154 and receives supply voltage line $V_{SPD}$ 156 from the host interface 122. $V_{SPD}$ 156 is a standardized voltage (e.g., typically 3.3 V). Serial presence detect (SPD) refers to a standardized way to automatically access information about a computer memory module (e.g., storage device 120). In some embodiments, if the memory module has a failure, the failure can be communicated with a host system (e.g., computer system 110) via SPD bus 154.

Power fail module 126 is coupled with host interface 122, supervisory controller 124, and power control 127. Power fail module 126 is configured to monitor one or more input voltages (e.g., $V_{dd}$ 152 and, optionally, $V_{SPD}$ 156) provided to storage device 120 by a host system (e.g., computer system 110). In response to detecting a power fail condition (e.g., an under or over voltage event) as to an input voltage, power fail module 126 is configured to provide a PFAIL signal to supervisory controller 124 and, in some circumstances, discharge an energy storage device to provide power to storage controller 128 and NVM controllers 130. For a more detailed description of power fail module 126, see the description of FIGS. 3-5. In response to receiving the PFAIL signal indicating a power fail condition from power fail module 126, supervisory controller 124 performs one or more operations of a power fail process including, but not limited to, signaling the power fail condition to a plurality of controllers on storage device 120 (e.g., storage controller 128 and NVM controllers 130) via control lines 162.

Power control 127 is coupled with supervisory controller 124, power fail module 126, storage controller 128, and NVM controllers 130 (connection not shown) in order to provide power to these components. In some embodiments, power control 127 includes one or more voltage regulators controlled by supervisory controller 124 via control line 162. Furthermore, in some implementations, power control 127 is configured to remove power from a specified NVM controller 130 in response to a command from supervisory controller 124 via control line 162.

Storage controller 128 is coupled with host interface 122, supervisory controller 124, power control 127, and NVM controllers 130. In some embodiments, during a write operation, storage controller 128 receives data via data bus 158 from computer system 110 through host interface 122 and during a read operation, storage controller 128 sends data to computer system 110 through host interface 122 via data bus 158. Further, host interface 122 provides additional data, signals, voltages, and/or other information needed for communication between storage controller 128 and computer system 110. In some embodiments, storage controller 128 and host interface 122 use a defined interface standard for communication, such as double data rate type three synchronous dynamic random access memory (DDR3). In some embodiments, storage controller 128 and NVM controllers 130 use a defined interface standard for communication, such as serial advance technology attachment (SATA). In some other implementations, the device interface used by storage controller 128 to communicate with NVM controllers 130 is SAS (serial attached SCSI), or other storage interface. In some embodiments, storage controller 128 maps DDR interface commands from the host system (e.g., computer system 1120) to SATA or SAS interface commands for the plurality of controllers (e.g., storage controller 128 and NVM controllers 130).

Figure 2A:
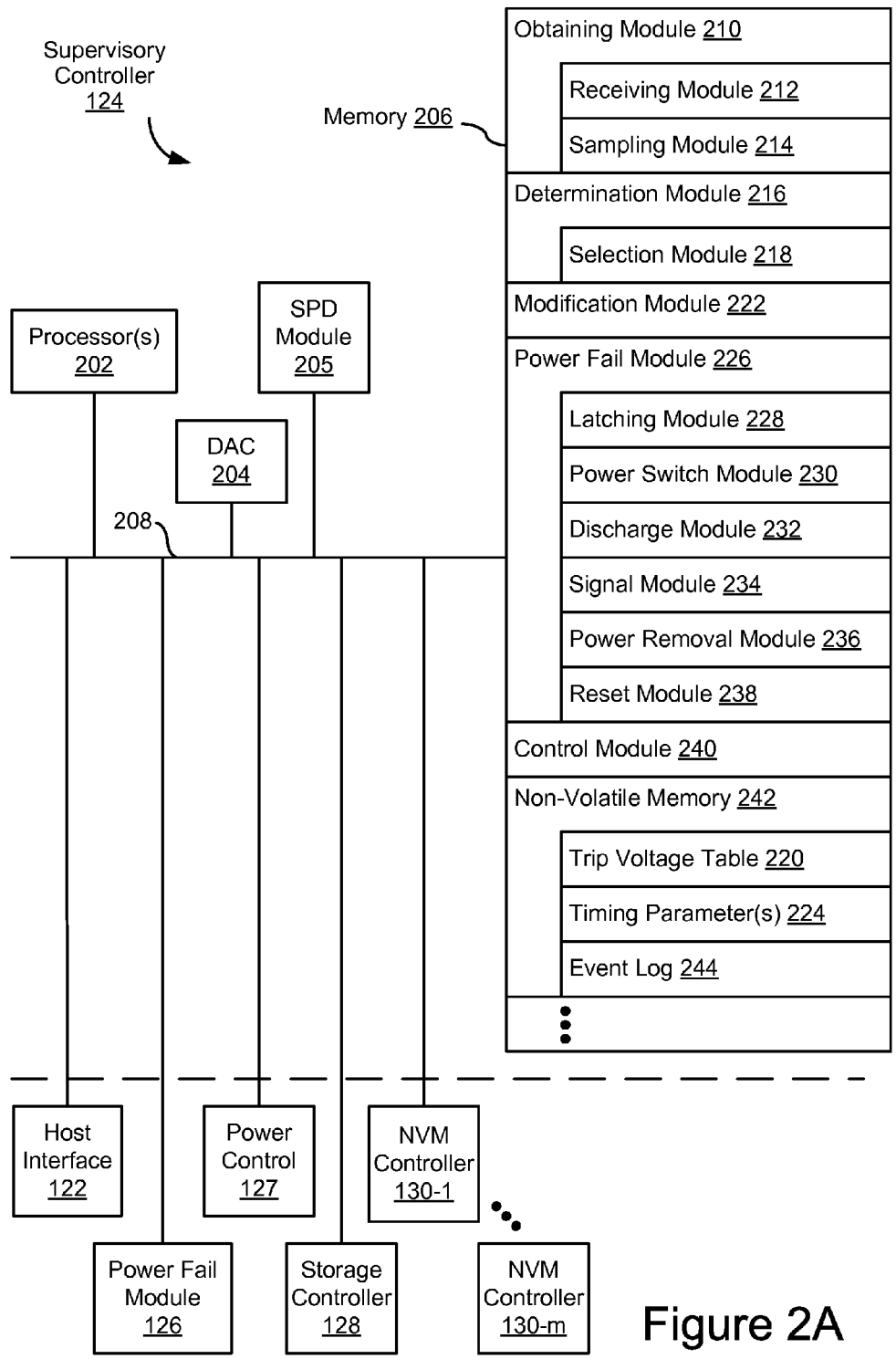
FIG. 2A is a block diagram illustrating an implementation of a supervisory controller in accordance with some embodiments.

FIG. 2A is a block diagram illustrating an implementation of supervisory controller 124 in accordance with some embodiments. Supervisory controller 124 includes one or more processors 202 (sometimes called CPUs or processing units) for executing modules, programs and/or instructions stored in memory 206 and thereby performing processing operations, serial presence detect (SPD) module 205 (e.g., non-volatile memory) storing information related to storage device 120 (e.g., a serial number, memory type, supported communication protocol, etc.), memory 206, optionally a digital-to-analog converter (DAC) 204 for converting digital values to an analog signal (e.g., a portion of an integrated or partially integrated DAC/ADC), and one or more communication buses 208 for interconnecting these components. Communication buses 208, optionally, include circuitry (sometimes called a chipset) that interconnects and controls communications between system components. Supervisory controller 124 is coupled with host interface 122, power fail module 126, power control 127, storage controller 128, and NVM controllers 130 (e.g., NVM controllers 130-1 through 130-*m*) by communication buses 208.

Figure 4A:
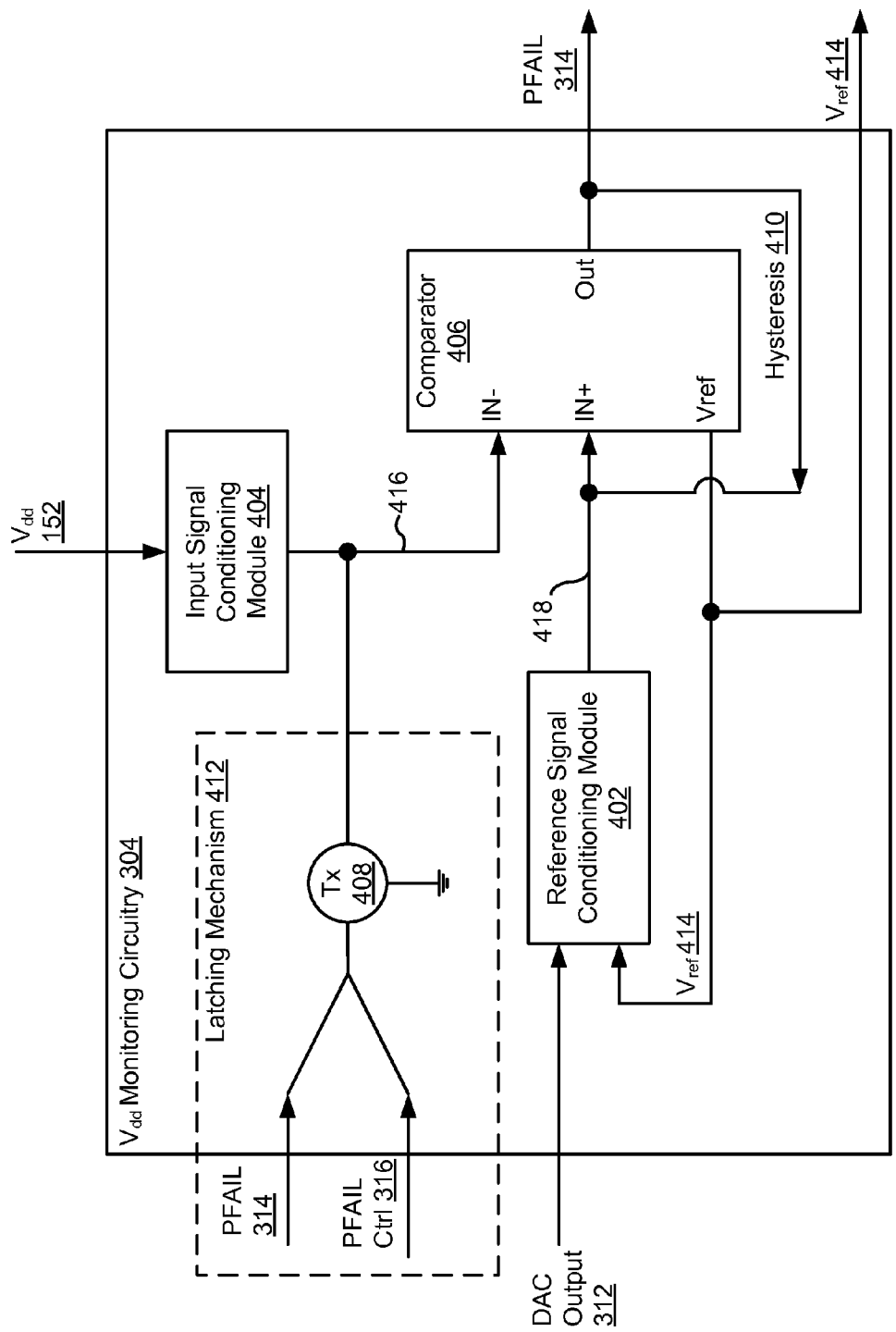
FIG. 4A is a block diagram illustrating an implementation of a portion of voltage monitoring circuitry in accordance with some embodiments.
Figure 5:
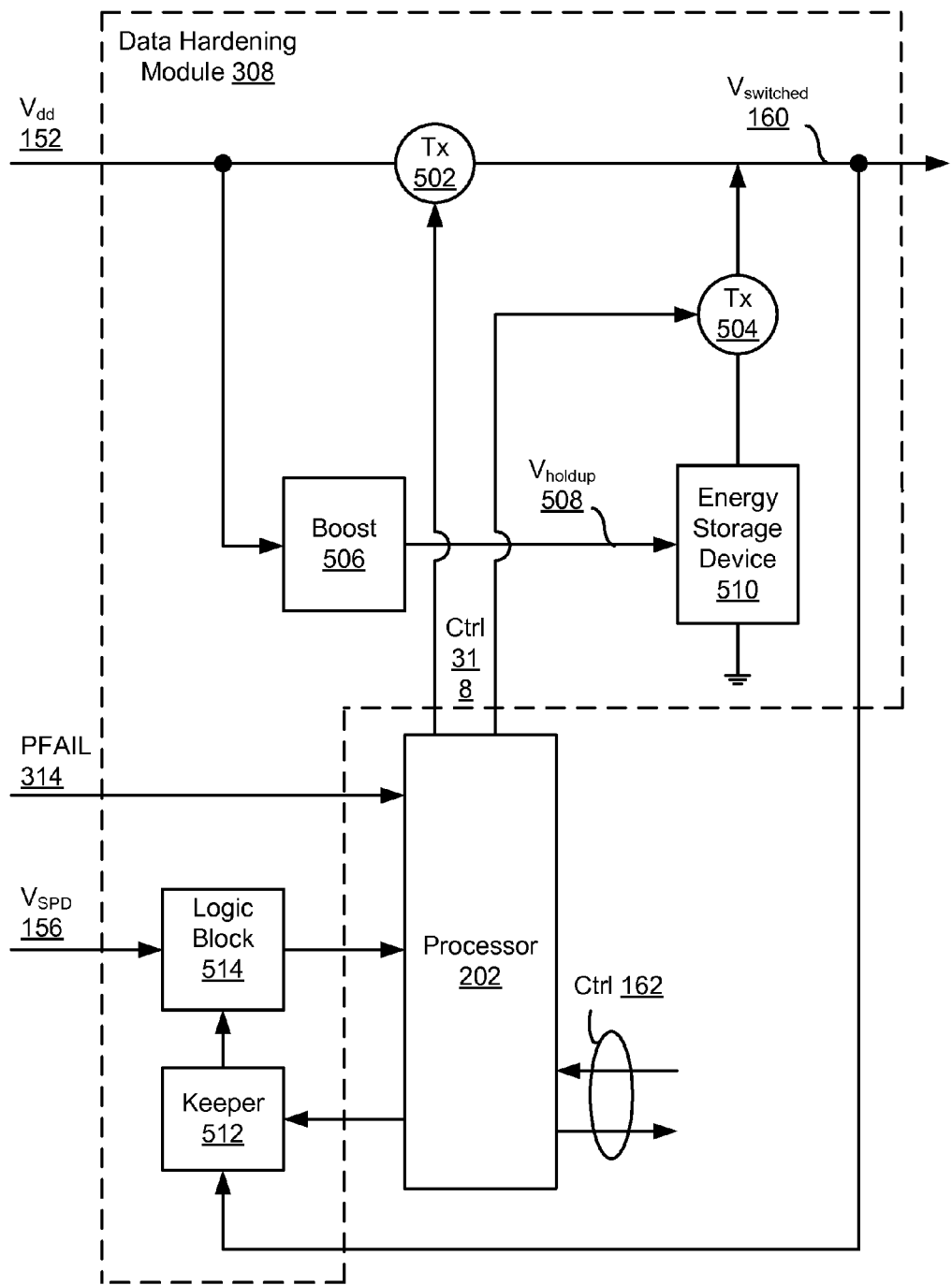
FIG. 5 is a block diagram illustrating an implementation of a data hardening module in accordance with some embodiments.

Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206, optionally, includes one or more storage devices remotely located from processor(s) 202. Memory 206, or alternately the non-volatile memory device(s) within memory 206, comprises a non-transitory computer readable storage medium. In some embodiments, memory 206, or the computer readable storage medium of memory 206, stores the following programs, modules, and data structures, or a subset or superset thereof:

obtaining module 210 for obtaining one or more configuration parameters, including:

optionally, a receiving module 212 for receiving one or more configuration parameters from computer system 110; and sampling module 214 for sampling $V_{dd}$ 152 (connection not shown) to determine one or more configuration parameters (e.g., a default input voltage ($V_{dd}$) supplied by computer system 110);

determination module 216 for determining a trip voltage (sometimes called a "trip point") based on the one or more configuration parameters, optionally including:

selection module 218 for selecting a trip voltage from trip voltage table 220 based on the one or more configuration parameters, where trip voltage table 220 includes a plurality of predefined trip voltages;

optionally, a modification module 222 for modifying one or more timing parameters 224 based on the one or more configuration parameters and for modifying one or more trip voltages in trip voltage table 220 in response to a request from computer system 110;

power fail module 226 for performing one or more operations of a power fail process in response to detecting (or the triggering of) a power fail condition, including:

latching module 228 for latching, unlatching, or forcing the power fail condition (e.g., by controlling latching mechanism 412, FIG. 4A);

power switch module 230 for controlling $V_{switched}$ 160 (FIGS. 1 and 5);

discharge module 232 for discharging an energy storage device 510 (e.g., one or more hold-up capacitors) (see FIG. 5);

signal module 234 for signaling a power fail condition to a plurality of controllers on storage device 120 (e.g., storage controller 128 and NVM controllers 130, FIG. 1);

power removal module 236 for removing power from the plurality of controllers on storage device 120 (e.g., by controlling power control 127, FIG. 1); and reset module 238 for resetting one or more of the plurality of controllers on storage device 120 (e.g., storage controller 128 and NVM controllers 130, FIG. 1);

control module 240 for coordinating the operations of storage device 120, including supervisory, control, and power fail functions; and non-volatile memory 242 for storing information related to the operations of storage device 120, optionally including:

event log 244 for storing the time and occurrence of events (e.g., the occurrence of a power fail condition).

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing any of the methods described below with reference to FIGS. 6A-6C.

Although FIG. 2A shows supervisory controller 124, FIG. 2A is intended more as a functional description of the various features which may be present in supervisory controller 124 than as a structural schematic of the embodiments described herein. In practice, and as recognized by those of ordinary skill in the art, items shown separately could be combined and some items could be separated.

Figure 2B:
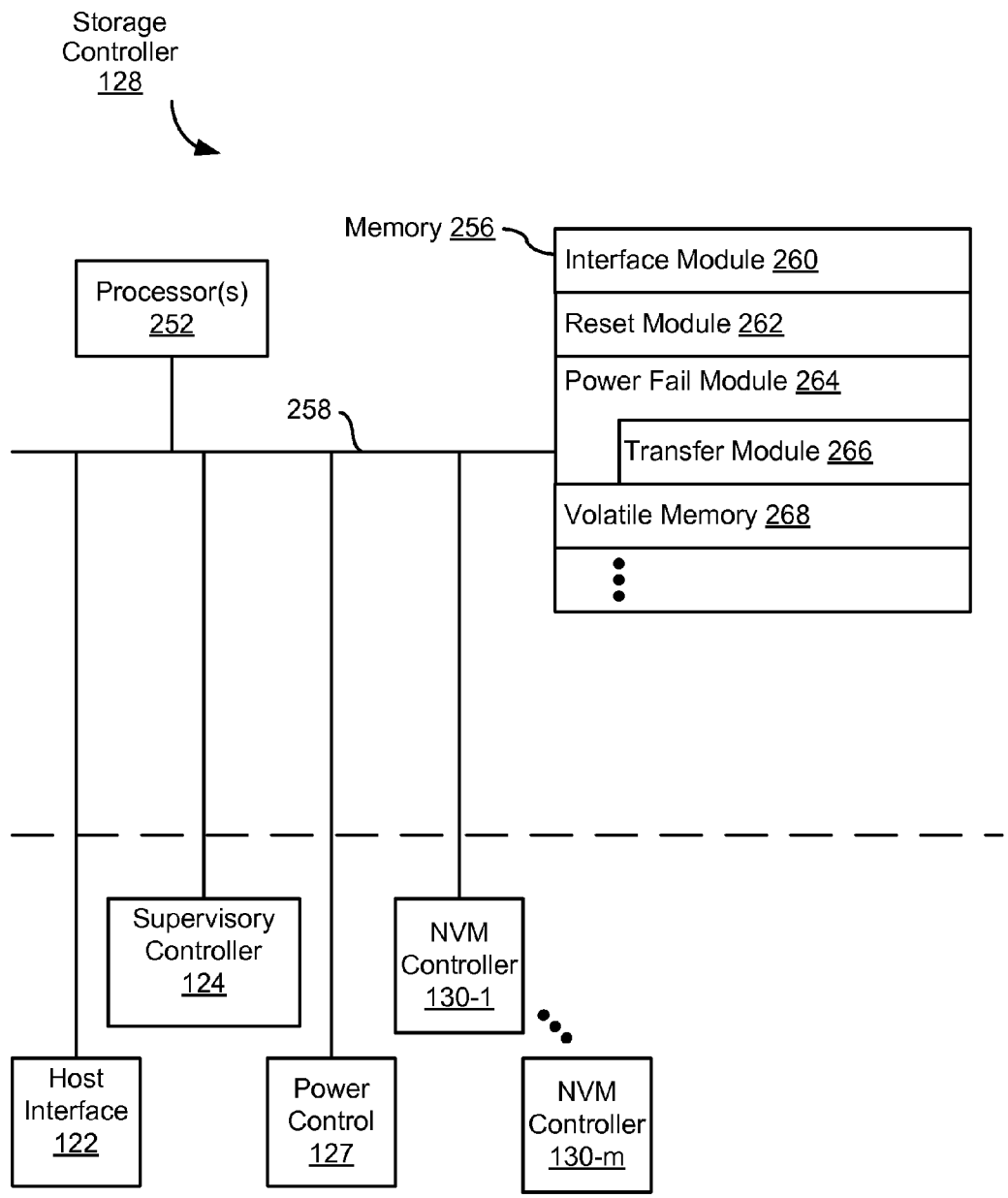
FIG. 2B is a block diagram illustrating an implementation of a storage controller in accordance with some embodiments.

FIG. 2B is a block diagram illustrating an implementation of a storage controller 128 in accordance with some embodiments. Storage controller 128, typically, includes one or more processors 252 (sometimes called CPUs or processing units) for executing modules, programs and/or instructions stored in memory 256 and thereby performing processing operations, memory 256, and one or more communication buses 258 for interconnecting these components. Communication buses 258, optionally, include circuitry (sometimes called a chipset) that interconnects and controls communications between system components. Storage controller 128 is coupled with host interface 122, supervisory controller 124, power control 127, and NVM controllers 130 (e.g., NVM controllers 130-1 through 130-m) by communication buses 258.

Memory 256 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 256, optionally, includes one or more storage devices remotely located from processor(s) 252. Memory 256, or alternately the non-volatile memory device(s) within memory 256, comprises a non-transitory computer readable storage medium. In some embodiments, memory 256, or the computer readable storage medium of memory 256, stores the following programs, modules, and data structures, or a subset or superset thereof:

- interface module 260 for communicating with other components, such as host interface 122, supervisory controller 124, power control 127, and NVM controllers 130;
- reset module 262 for resetting storage controller 128; and
- power fail module 264 for performing a power fail operation in response to a signal of a power fail condition from supervisory controller 124.

In some embodiments, the power fail module 264, optionally, includes a transfer module 266 for transferring data held in volatile memory 268 to non-volatile memory.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 256 may store a subset of the modules and data structures identified above. Furthermore, memory 256 may store additional modules and data structures not described above.

Although FIG. 2B shows storage controller 128, FIG. 2B is intended more as a functional description of the various features which may be present in storage controller 128 than as a structural schematic of the embodiments described herein. In practice, and as recognized by those of ordinary skill in the art, items shown separately could be combined and some items could be separated.

Figure 2C:
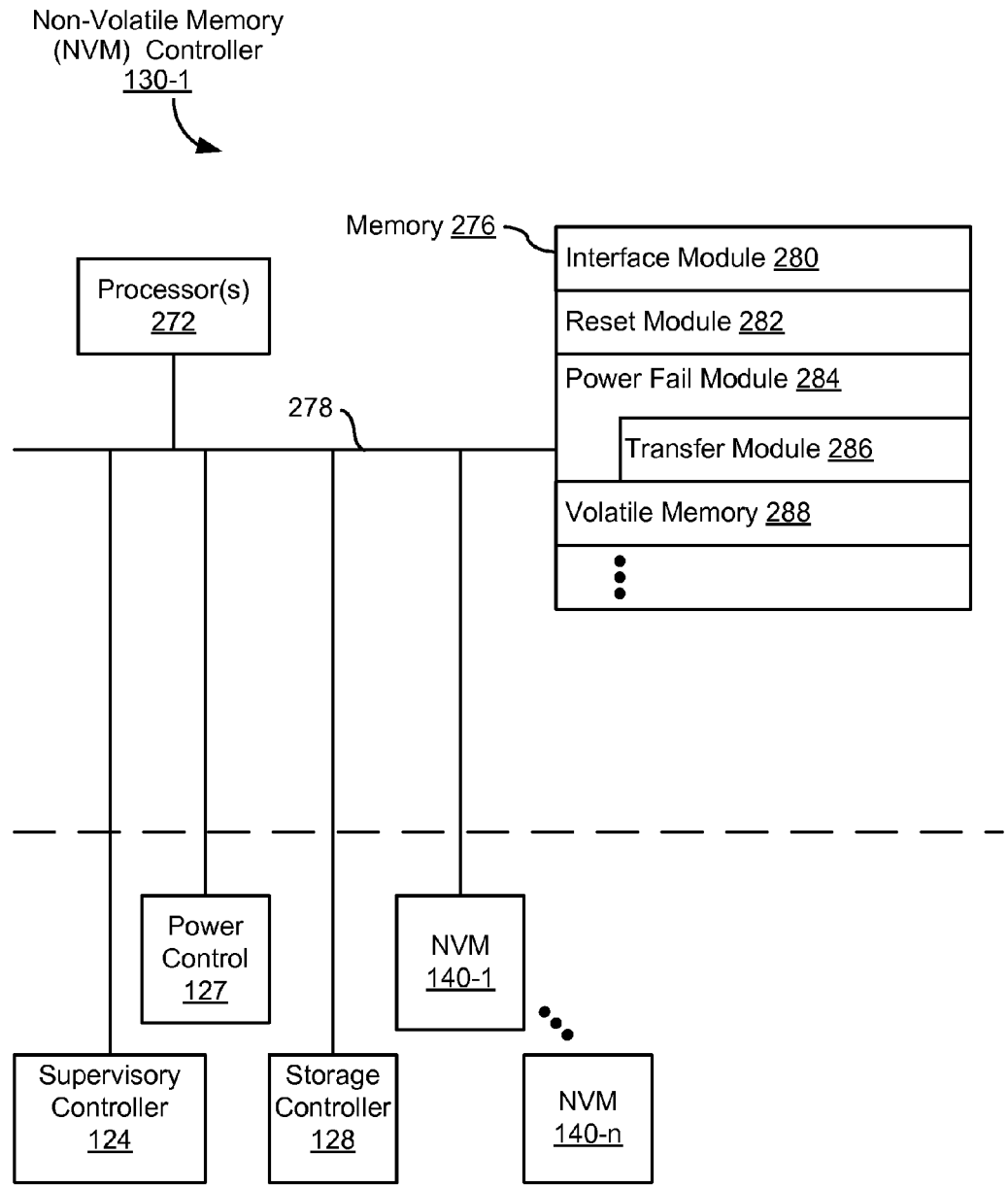
FIG. 2C is a block diagram illustrating an implementation of a non-volatile memory (NVM) controller in accordance with some embodiments.

FIG. 2C is a block diagram illustrating an implementation of representative NVM controller 130-1 in accordance with some embodiments. NVM controller 130-1 typically includes one or more processors 272 (sometimes called CPUs or processing units) for executing modules, programs and/or instructions stored in memory 276 and thereby performing processing operations, memory 276, and one or more communication buses 278 for interconnecting these components. Communication buses 278 optionally include circuitry (sometimes called a chipset) that interconnects and controls communications between system components. NVM controller 130-1 is coupled with supervisory controller 124, power control 127, storage controller 128, and NVM devices 140 (e.g., NVM devices 140-1 through 140-n) by communication buses 278.

Memory 276 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 276, optionally, includes one or more storage devices remotely located from processor(s) 272. Memory 276, or alternately the non-volatile memory device(s) within memory 276, comprises a non-transitory computer readable storage medium. In some embodiments, memory 276, or the computer readable storage medium of memory 276, stores the following programs, modules, and data structures, or a subset or superset thereof:

- interface module 280 for communicating with other components, such as supervisory controller 124, power control 127, storage controller 128, and NVM devices 140;
- reset module 282 for resetting NVM controller 130-1; and
- power fail module 284 for performing a power fail operation in response to a signal of a power fail condition from supervisory controller 124.

In some embodiments, power fail module 284, optionally, includes a transfer module 286 for transferring data held in volatile memory 288 to non-volatile memory.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 276 may store a subset of the modules and data structures identified above. Furthermore, memory 276 may store additional modules and data structures not described above.

Although FIG. 2C shows NVM controller 130-1, FIG. 2C is intended more as a functional description of the various features which may be present in NVM controller 130-1 than as a structural schematic of the embodiments described herein. In practice, and as recognized by those of ordinary skill in the art, items shown separately could be combined and some items could be separated. Further, although FIG. 2C shows representative NVM controller 130-1, the description of FIG. 2C similarly applies to other NVM controllers (e.g., NVM controllers 130-2 through 130-m) in storage device 120, as shown in FIG. 1.

Figure 3:
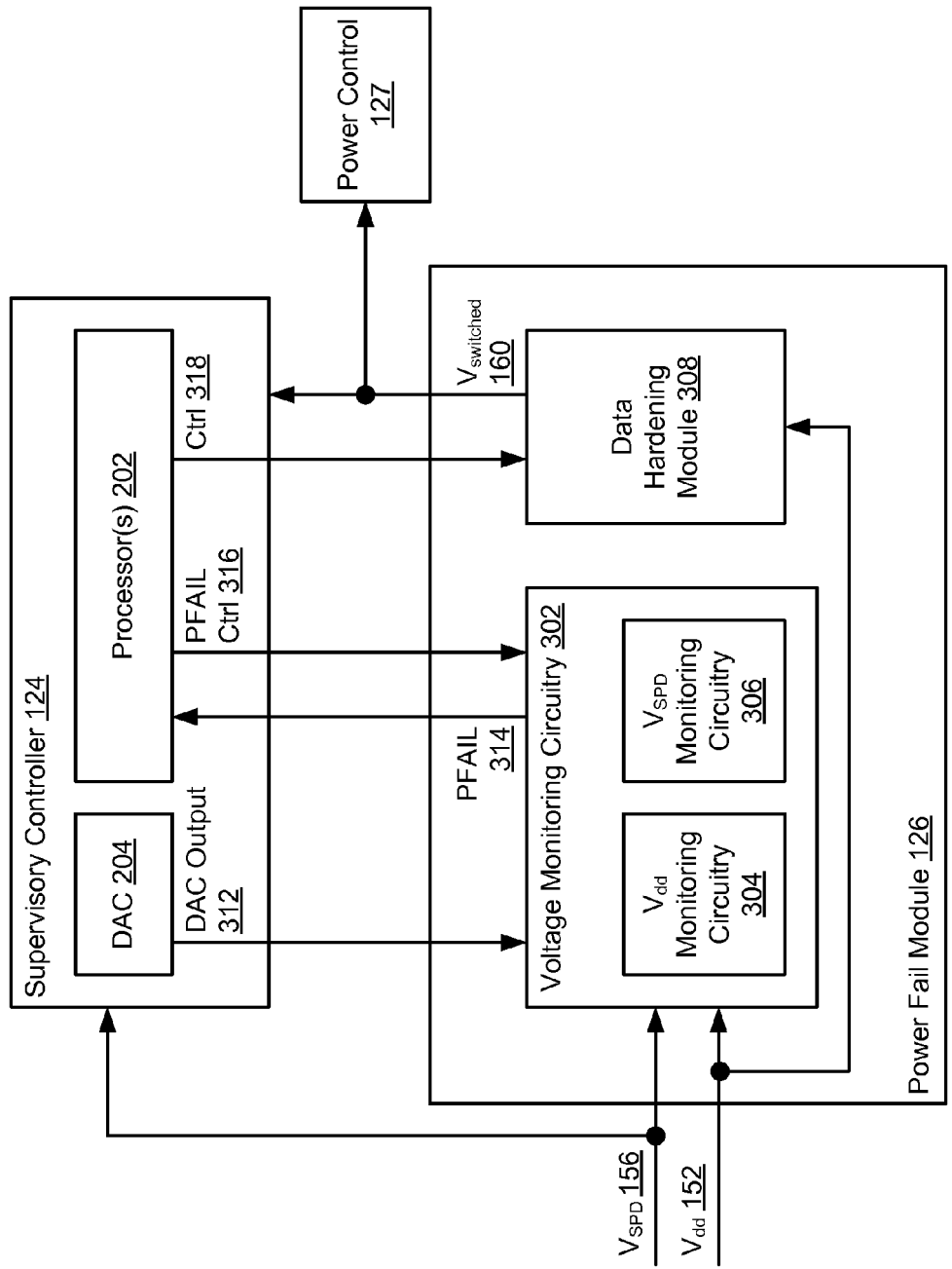
FIG. 3 is a block diagram illustrating a portion of a data storage device in accordance with some embodiments.

FIG. 3 is a block diagram illustrating an implementation of a portion of storage device 120 in accordance with some embodiments. While some example features are illustrated, various other features have not been illustrated for the sake of brevity and so as not to obscure more pertinent aspects of the example implementations disclosed herein. To that end, as a non-limiting example, supervisory controller 124 includes one or more processors 202 and DAC 204, and power fail module 126 includes voltage monitoring circuitry 302 and data hardening module 308. In some embodiments, DAC 204 is a component of one or more processors 202. In some embodiments, $V_{dd}$ 152 is a voltage supplied by the host system (e.g., computer system 110, FIG. 1) and has a target value of 1.5 V or less (e.g., 1.25 V, 1.35 V, or 1.5 V). For example, for a double data rate type three (DDR3) interface specification, the input (or supply) voltage is 1.25 V, 1.35 V or 1.5 V. In some embodiments, $V_{SPD}$ 156 is a voltage supplied by the host system for a serial presence detect (SPD) functionality and has a target value of 3.3 V.

In some embodiments, voltage monitoring circuitry 302 is configured to detect a power fail condition (e.g., an under or over voltage event) as to an input voltage (e.g., $V_{dd}$ 152 or $V_{SPD}$ 156) supplied by a host system (e.g., computer system 110, FIG. 1) and signal the power fail condition to supervisory controller 124. In some embodiments, voltage monitoring circuitry 302 includes $V_{dd}$ monitoring circuitry 304 configured to detect an under or over voltage event as to $V_{dd}$ 152 and $V_{SPD}$ monitoring circuitry 306 configured to detect an under or over voltage event as to $V_{SPD}$ 156. For a more detailed description of $V_{dd}$ monitoring circuitry 304, see the description of FIG. 4A. For a more detailed description of $V_{SPD}$ monitoring circuitry 306, see the description of FIG. 4B.

In some embodiments, data hardening module 308 is configured to interconnect an energy storage device to provide power to storage controller 128 and NVM controllers 130. For a more detailed description of data hardening module 308, see the description of FIG. 5. For further description of data hardening module 308, see U.S. Provisional Patent Application No. 61/887,910 entitled "Power Sequencing and Data Hardening Circuitry Architecture," which is herein incorporated by reference.

FIG. 4A is a block diagram illustrating an implementation of a portion of voltage monitoring circuitry 302 ($V_{dd}$ monitoring circuitry 304) in accordance with some embodiments. While some example features are illustrated, various other features have not been illustrated for the sake of brevity and so as not to obscure more pertinent aspects of the example implementations disclosed herein. To that end, as a non-limiting example, $V_{dd}$ monitoring circuitry 304 includes reference signal conditioning module 402, input signal conditioning module 404, comparator 406, and transistor 408.

In some embodiments, as shown in FIG. 3, the reference signal is DAC output 312 from supervisory controller 124. For example, supervisory controller 124 or a component thereof (e.g., obtaining module 210, FIG. 2A) obtains one or more configuration parameters including an indication of the default value for $V_{dd}$ (e.g., 1.25 V, 1.35 V, or 1.5 V) that is supplied to storage device 120 by the host system. In this example, supervisory controller 124 or a component thereof (e.g., determination module 216, FIG. 2A) determines a trip voltage for $V_{dd}$ by selecting one of a plurality of predefined trip voltages from trip voltage table 220 based on the indication of the default value for $V_{dd}$ (e.g., included in the one or more configuration parameters). DAC 204 converts the digital value for the trip voltage to an analog value, and supervisory controller 124 provides DAC output 312 to $V_{dd}$ monitoring circuitry 304.

Referring once again to FIG. 4A, in some embodiments reference signal conditioning module 402 is configured to condition DAC output 312 (sometimes called a "reference signal," "trip voltage," or "trip point") prior to a comparison operation with this reference signal. In some embodiments, the conditioning includes one or more of buffering, filtering, scaling, and level shifting DAC output 312 to produce a reference comparison signal 418. In some embodiments, conditioning module 402 is implemented using well-known circuitry components (e.g., unity gain amplifier, low-pass RC filter, voltage divider, etc.), the exact configuration of which depends on the particular conditioning applied to DAC output 312. For example, the conditioning adjusts the trip voltage so that the full range of DAC values map to the practical range of trip voltages. In some embodiments, $V_{ref}$ 414 is a voltage-supply independent reference voltage supplied by comparator 406 and used by reference signal conditioning module 402 to level shift DAC output 312. For example, DAC output 312 starts as a low value (e.g., 1 V) and is raised to the proper trip voltage (e.g., 1.125 V, 1.215 V, or 1.35 V) by reference signal conditioning module 402.

In some embodiments, input signal conditioning module 404 is configured to condition $V_{dd}$ 152 (sometimes called an "input signal," "input voltage," or "supply voltage") supplied by the host system prior to a comparison operation with this input signal. In some embodiments, the conditioning includes one or more of buffering, filtering, and scaling $V_{dd}$ 152 to produce a comparison input signal 416 corresponding to $V_{dd}$ 152. In some embodiments, input signal conditioning module 404 is implemented using well-known circuitry components (e.g., unity gain amplifier, low-pass RC filter, voltage divider, etc.), the exact configuration of which depends on the particular conditioning applied to the $V_{dd}$ 152.

In some embodiments, comparator 406 is configured to perform a comparison operation between the conditioned reference signal (e.g., the output of reference signal conditioning module 402) and the conditioned input signal (e.g., the output of input signal conditioning module 404). If the conditioned input signal is less than (or, alternatively, greater than) the conditioned reference signal, comparator 406 is configured to output PFAIL signal 314 to supervisory controller 124 (e.g., logic high). For example, in FIG. 4A, PFAIL signal 314 indicates the occurrence of a power fail condition (e.g., an under or over voltage event) as to $V_{dd}$ 152. Additionally, comparator 406 is configured to provide hysteresis 410 of the result of the comparison operation for subsequent comparisons (e.g., 3 to 10 mV of feedback). In some embodiments, comparator 406 is also configured to provide $V_{ref}$ 414 to one or more other components of storage device 120 (e.g., supervisory controller 124 and $V_{SPD}$ monitoring circuitry 306).

In some embodiments, latching mechanism 412 is configured to latch, unlatch, or force (e.g., simulate) the power fail condition. In some embodiments, when comparator 406 indicates the occurrence of a power fail condition as to $V_{dd}$ 152, PFAIL signal 314 (e.g., logic high) is provided to latching mechanism 412. PFAIL signal 314 enables transistor 408 (closed state) which shorts the input signal (e.g., a level adjusted and scaled comparison input signal 416 corresponding to $V_{dd}$ 152) to ground, which latches the power fail condition.

In addition to having a mechanism for latching the power fail condition, in some embodiments, supervisory controller 124 or a component thereof (e.g., latching module 228, FIG. 2A) is configured to unlatch the power fail condition by providing a PFAIL control signal 316 (e.g., logic low) that disables transistor 408 (open state), which unlatches the power fail condition—by allowing the comparison input signal 416 to reach the comparator 406 without being shorted to ground. In some embodiments, supervisory controller 124 or a component thereof (e.g., latching module 228, FIG. 2A) is also configured to force the power fail condition to occur by providing PFAIL control signal 316 (e.g., logic high) that enables transistor 408 (closed state) which shorts the comparison input signal 416 to ground, which forces the comparator 406 to generate PFAIL signal 314. Furthermore, in some implementations, PFAIL control signal 316 is tristated (e.g., put into a high impedance state) by supervisory controller 124 when supervisory controller 124 is neither unlatching the power fail condition nor forcing a power fail condition, which disables transistor 408 unless PFAIL 314 is asserted (e.g., logic high). For further information concerning forcing or simulating the power fail condition, see U.S. Provisional Patent Application No. 61/903,895, filed Nov. 13, 2013, entitled "Simulated Power Failure and Data Hardening Circuitry Architecture," which is herein incorporated by reference in its entirety.

Figure 4B:
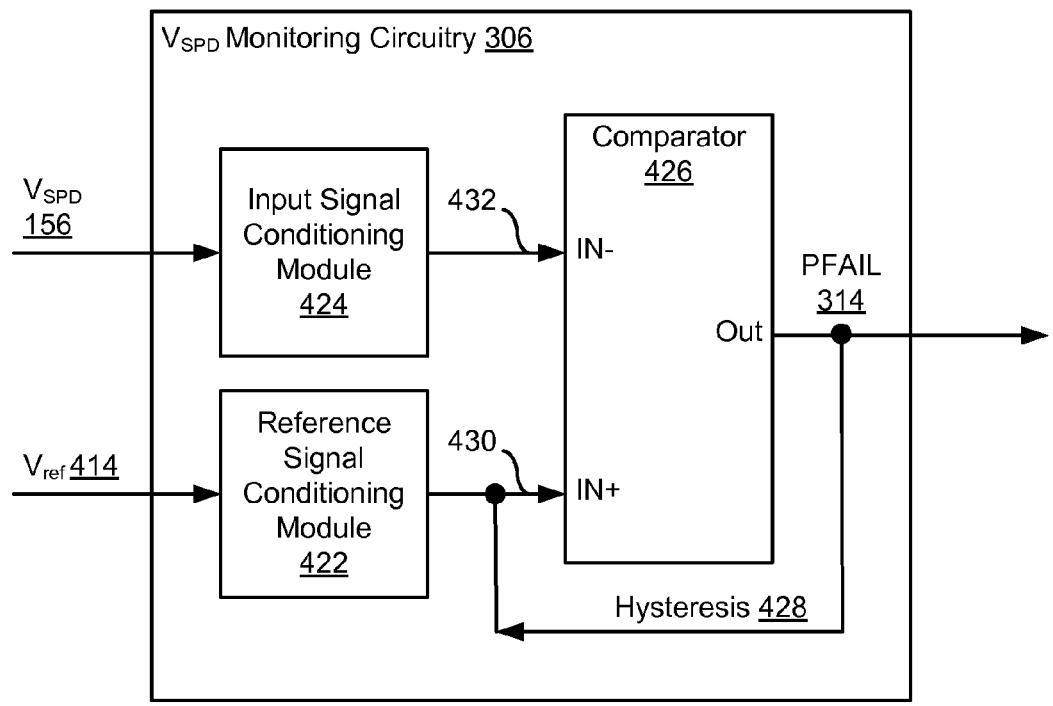
FIG. 4B is a block diagram illustrating an implementation of a portion of voltage monitoring circuitry in accordance with some embodiments.

FIG. 4B is a block diagram illustrating an implementation of a portion of voltage monitoring circuitry 302 ($V_{SPD}$ monitoring circuitry 306) in accordance with some embodiments. While some example features are illustrated, various other features have not been illustrated for the sake of brevity and so as not to obscure more pertinent aspects of the example implementations disclosed herein. To that end, as a non-limiting example, $V_{SPD}$ monitoring circuitry 306 includes reference signal conditioning module 422, input signal conditioning module 424, and comparator 426. In some embodiments, the reference signal is $V_{ref}$ 414 from comparator 406 of $V_{dd}$ monitoring circuitry 304, as shown in FIG. 4A. For example, $V_{ref}$ 414 is a voltage-supply independent reference voltage (e.g., a predetermined voltage such as 1.23 V). In some embodiments, the input signal is $V_{SPD}$ 156 supplied by the host system (e.g., with a target voltage of 3.3V).

In some embodiments, reference signal conditioning module 422 is configured to condition $V_{ref}$ 414 (sometimes called a "reference signal," "trip voltage," or "trip point") prior to a comparison operation with this reference signal. In some embodiments, the conditioning includes one or more of buffering and filtering $V_{ref}$ 414 with a plurality of well-known circuitry components (e.g., unity gain amplifier, low-pass RC filter, etc.) to produce a conditioned $V_{ref}$ comparison signal 430. In some embodiments, input signal conditioning module 424 is configured to condition $V_{SPD}$ 156 (sometimes called an "input signal," "input voltage," or "supply voltage") supplied by the host system prior to a comparison operation with this input signal. In some embodiments, the conditioning includes one or more of buffering, filtering, and scaling $V_{SPD}$ 156 with a plurality of well-known circuitry components (e.g., unity gain amplifier, low-pass RC filter, voltage divider, etc.) to produce a conditioned $V_{SPD}$ comparison signal 432. For example, if $V_{ref}$ 414 is 1.23 V and the target voltage for $V_{SPD}$ 156 is 3.3 V, input signal conditioning module 424 includes a low-pass RC filter to filter out any ripples or glitches in $V_{SPD}$ 156 and, also, a voltage divider to scale down $V_{SPD}$ 156 (e.g., by approximately 73% or a factor of 2.7).

In some embodiments, comparator 426 is configured to perform a comparison operation between the conditioned reference signal 430 (e.g., the output of reference signal conditioning module 422) and the conditioned input signal 432 (e.g., the output of input signal conditioning module 424). If the conditioned input signal 432 is less than (or, alternatively, greater than) the conditioned reference signal 430, comparator 426 is configured to output PFAIL signal 314 to supervisory controller 124 (e.g., logic high). For example, in FIG. 4B, PFAIL signal 314 indicates the occurrence of a power fail condition (e.g., an under or over voltage event) as to $V_{SPD}$ 156. Additionally, comparator 426 is configured to provide hysteresis 428 of the result of the comparison operation for subsequent comparisons.

FIG. 5 is a block diagram illustrating an implementation of data hardening module 308 in accordance with some embodiments. While some example features are illustrated, various other features have not been illustrated for the sake of brevity and so as not to obscure more pertinent aspects of the example implementations disclosed herein. To that end, as a non-limiting example, data hardening module 308 includes transistors 502 and 504, boost circuitry 506, energy storage device 510, keeper circuitry 512, and logic block 514.

In some embodiments, $V_{holdup}$ 508 is a boosted voltage, higher than $V_{dd}$ 152, and has a target value of 5.7 V. In some embodiments, $V_{holdup}$ 508 is used to charge an energy storage device 510 (e.g., one or more hold-up capacitors). Further, in some embodiments, only one of transistors 502, 504 is enabled at any one time. In some embodiments, data hardening circuit 308's energy storage device 510 stores, immediately prior to a power fail condition being detected, at least approximately 30 to 70 mJ of energy per NVM controller 130 in storage device 120.

In some embodiments, supervisory controller 124 or a component thereof (e.g., processor 202) monitors and manages the functionality of data hardening module 308. For example, in response to receiving PFAIL signal 314 from voltage monitoring circuitry 302 indicating the power fail condition, supervisory controller 124 or a component thereof (e.g., processor 202) is configured to perform one or more operations of a power fail process including controlling transistors 502 and 504 so that $V_{switched}$ 160 is the voltage from energy storage device 510, and energy storage device 510 is used (sometimes said to be "discharged") to provide power to storage device 120.

In some embodiments, during regular operation of storage device 120, $V_{dd}$ 152 is used to supply power to storage device 120. However, during the power fail process, energy storage device 510 is used to provide power to storage device 120. In some embodiments, supervisory controller 124 or a component thereof (e.g., processor 202) controls transistors 502 and 504 via control lines 318 to control $V_{switched}$ 160 to be voltage from $V_{dd}$ 152 (e.g., during regular operation) or voltage from energy storage device 510 (e.g., during the power fail process). For example, during regular operation of storage device 120, transistor 502 is turned on (e.g., to complete the connection between $V_{dd}$ 152 and $V_{switched}$ 160) and transistor 504 is turned off (e.g., to disable the connection between energy storage device 510 and $V_{switched}$ 160) so that $V_{dd}$ 152 is used to supply power to storage device 120. However, during the power fail process, transistor 502 is turned off (e.g., to disable the connection between $V_{dd}$ 152 and $V_{switched}$ 160) and transistor 504 is turned on (e.g., to enable the connection between energy storage device 510 and $V_{switched}$ 160) so that energy storage device 510 is used to provide power to storage device 120. Although a single energy storage device 510 is shown in FIG. 5, any energy storage device, including one or more capacitors, one or more inductors, or one or more other passive elements that store energy, may be used to store energy to be used during the power fail process.

In some embodiments, energy storage device 510 is charged using $V_{holdup}$ 508, a voltage higher than $V_{dd}$ 152. In some embodiments, $V_{dd}$ 152 is boosted up to $V_{holdup}$ 508 using boost circuitry 506 (e.g., 1.35 V or 1.5 V is boosted up to 5.7 V). In some embodiments, boost circuitry 506 is controlled and enabled by supervisory controller 124 (e.g., via processor 202).

Further, in some embodiments, $V_{switched}$ 160 is used as an input to keeper circuitry 512, which along with $V_{SPD}$ 156 provides power to processor 202. During the power fail process, $V_{switched}$ 160 is provided via keeper circuitry 512 to processor 202 so as to provide power to processor 202. In some embodiments, $V_{SPD}$ 156 provides power to keeper circuitry 512. In some embodiments, logic block 514 (e.g., OR or XOR) determines which of keeper circuitry 512 or $V_{SPD}$ 156 provides power to supervisory controller 124 (e.g., processor 202).

Furthermore, in some embodiments, during a power up sequence, $V_{SPD}$ 156 is provided to storage device 120 before $V_{dd}$ 152 is provided to storage device 120. This allows devices in storage device 120 (e.g., supervisory controller 124 and, in turn, processor 202) to operate before main power $V_{dd}$ 152 is provided to storage device 120. In some embodiments, supervisory controller 124 or a component thereof (e.g., processor 202) includes one or more connections 162 used to monitor and control other functions within storage device 120.

Figure 6A:
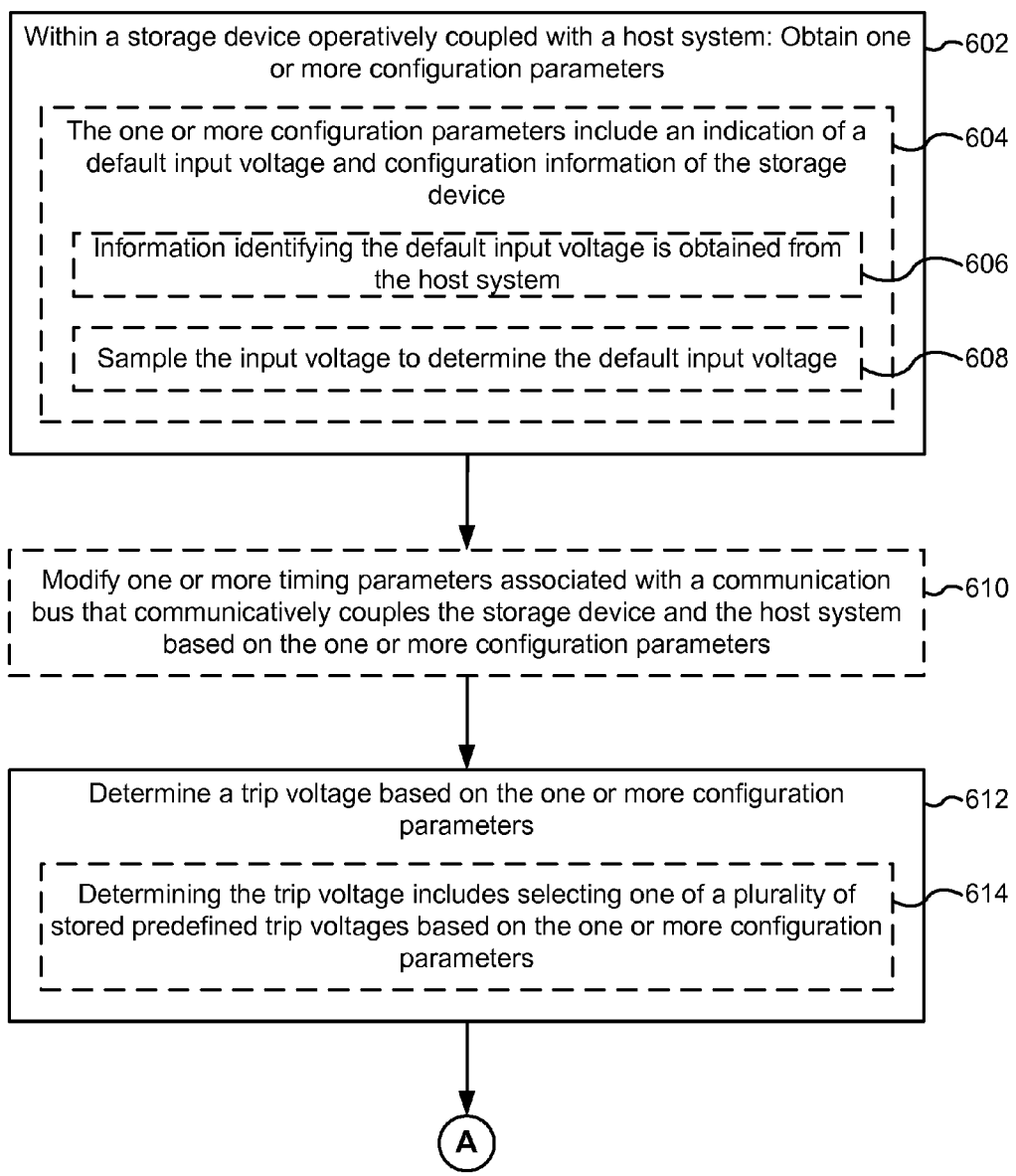
FIGS. 6A-6C illustrate a flowchart representation of a method of adjusting trip points in a data storage device in accordance with some embodiments.
Figure 6B:
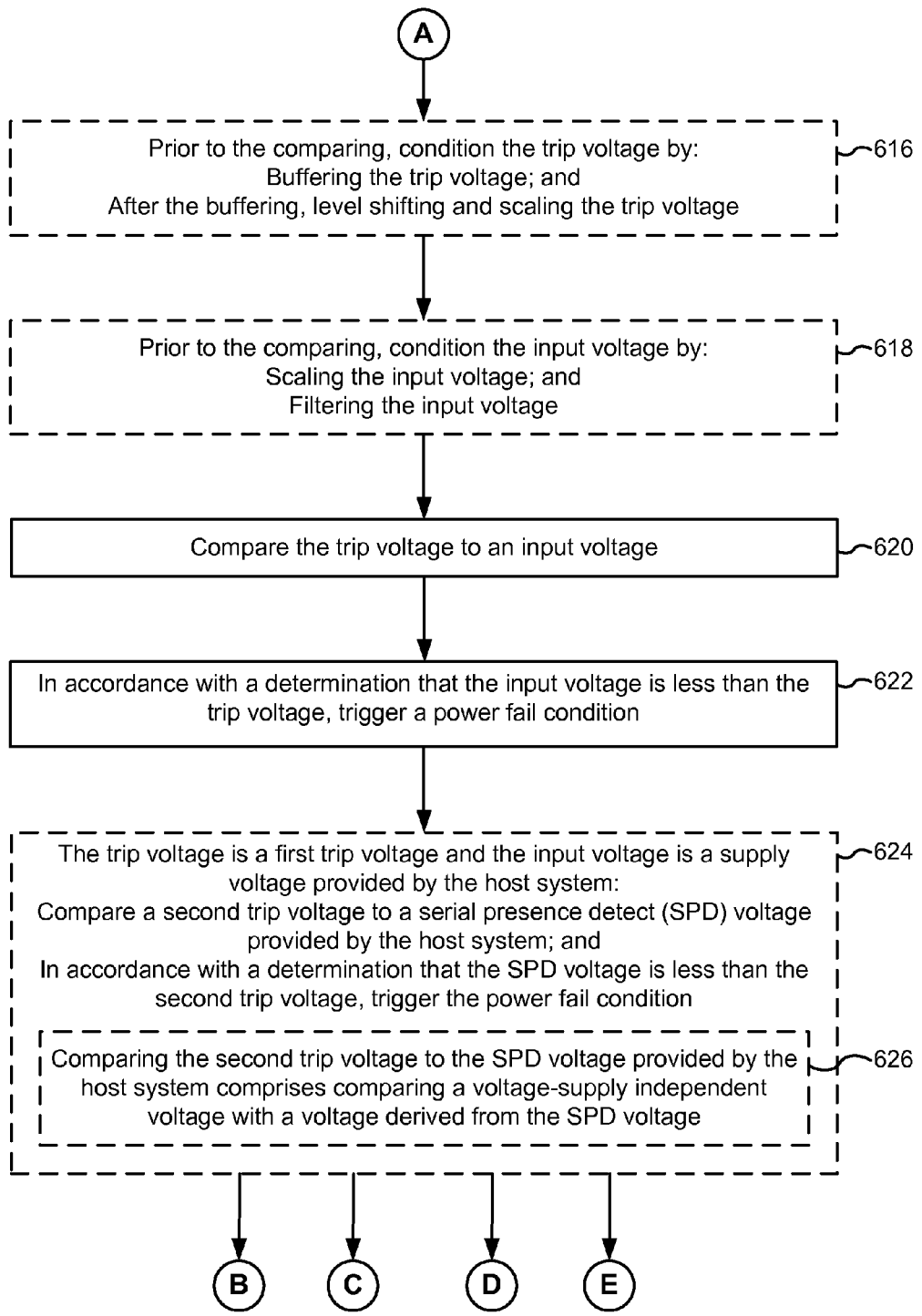
Figure 6C:
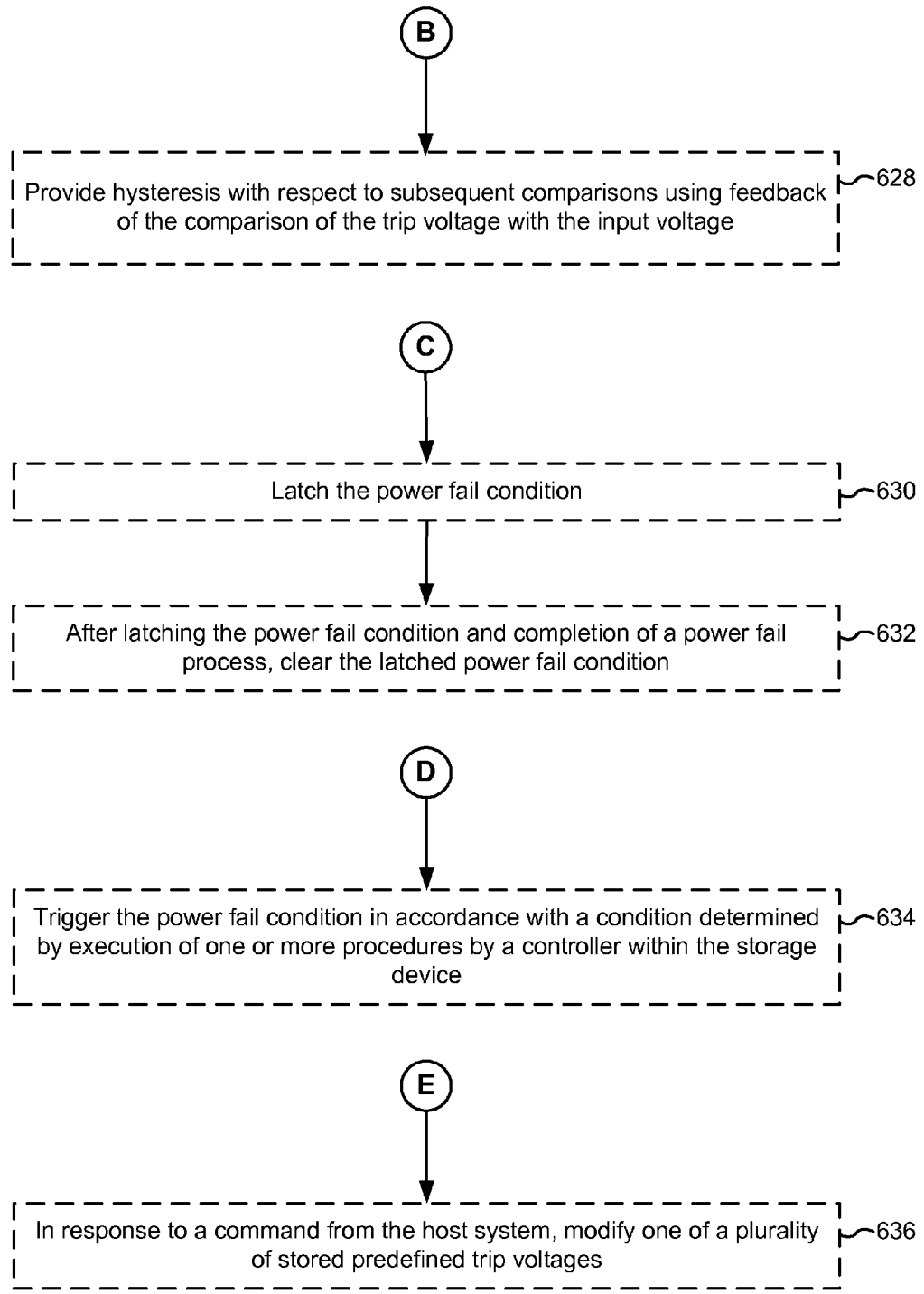

FIGS. 6A-6C illustrate a flowchart representation of a method 600 of adjusting trip points (e.g., a trip voltage that triggers a power fail process) in a data storage device in accordance with some embodiments. At least in some embodiments, method 600 is performed by a storage device (e.g., storage device 120, FIG. 1) or one or more components of the storage device (e.g., supervisory controller 124, power fail module 126, storage controller 128, and/or NVM controllers 130, FIG. 1), where the storage device is operatively coupled with a host system (e.g., computer system 110, FIG. 1). In some embodiments, method 600 is governed by instructions that are stored in a non-transitory computer readable storage medium and that are executed by one or more processors of a device, such as the one or more processors 202 of supervisory controller 124, the one or more processors 252 of storage controller 128, and/or the one or more processors 272 of NVM controllers 130, as shown in FIGS. 2A-2C.

A storage device (e.g., storage device 120, FIG. 1) obtains (602) one or more configuration parameters. In some embodiments, supervisory controller 124 or a component thereof (e.g., obtaining module 210, FIG. 2A) is configured to obtain one or more configuration parameters associated with storage device 120.

In some embodiments, the one or more configuration parameters include (604) an indication of a default input voltage and configuration information of the storage device. For example, the one or more configuration parameters include an indication of the default input voltage (e.g., $V_{dd}$) supplied by the host system (e.g., computer system 110, FIG. 1) to storage device 120 or voltage class of storage device 120 (e.g., 1.25 V, 1.35 V, or 1.5 V) and information associated with the current configuration of storage device 120.

In some embodiments, information identifying the default input voltage is obtained (606) from the host system. In some embodiments, supervisory controller 124 or a component thereof (e.g., receiving module 212, FIG. 2A) is configured to receive an indication of the default input (or supply) voltage (e.g., $V_{dd}$) from the host system (e.g., computer system 110, FIG. 1). For example, receiving module 212 receives an indication of the default input voltage via SPD Bus 154 from the host system.

In some embodiments, the storage device samples (608) the input voltage to determine the default input voltage. In some embodiments, supervisory controller 124 or a component thereof (e.g., sampling module 214, FIG. 2A) is configured to sample the input voltage (e.g., $V_{dd}$) to determine the default input voltage. For example, sampling module 214 samples $V_{dd}$ upon power-on and/or restart of storage device 120 to determine the default input voltage. In another example, sampling module 214 determines the default input voltage by averaging a plurality of sample measurements of $V_{dd}$.

In some embodiments, the storage device modifies (610) one or more timing parameters associated with a communication bus that operatively couples the storage device and the host system based on the one or more configuration parameters. In some embodiments, supervisory controller 124 or a component thereof (e.g., modification module 222, FIG. 2A) is configured to modify one or more timing parameters 224 stored in non-volatile memory 242 based on the one or more configuration parameters. For example, modification module 222 modifies skew and timing parameters associated with the communication bus (e.g., DDR3) that operatively couples storage device 120 and the host system (e.g., computer system 110, FIG. 1) based on the default input voltage (e.g., $V_{dd}$) provided to storage device 120 or voltage class of storage device 120 (e.g., 1.25 V, 1.35 V, or 1.5 V).

The storage device determines (612) a trip voltage based on the one or more configuration parameters. In some embodiments, supervisory controller 124 or a component thereof (e.g., determination module 216, FIG. 2A) is configured to determine a trip voltage based on the one or more configuration parameters. For example, determination module 216 determines the trip voltage based on the default input voltage (e.g., $V_{dd}$) provided to storage device 120 or voltage class of storage device 120 (e.g., 1.25 V, 1.35 V, or 1.5 V). In some embodiments, the trip voltage varies depending on the target value of the voltage. For example, if the target value of the input voltage is 1.5 V, the trip voltage may be 1.5 V minus 5 percent (i.e., 1.425 V) or minus 10 percent (i.e., 1.35 V).

In some embodiments, determining the trip voltage includes selecting (614) one of a plurality of stored pre-defined trip voltages based on the one or more configuration parameters. In some embodiments, supervisory controller or a component thereof (e.g., selection module 218, FIG. 2A) is configured to select a trip voltage from a plurality of pre-defined trip voltages stored in trip voltage table 220 based on the one or more configuration parameters. In some embodiments, trip voltage table 220 includes a predefined trip voltage for each of a plurality potential default input voltages supplied by a host system or voltage classes of storage device 120 (e.g., 1.25 V, 1.35 V, or 1.5 V). For example, if the one or more configuration parameters indicate that the default input voltage (e.g., $V_{dd}$) is 1.5 V, selection module 218 selects a trip voltage from trip voltage table 220 that corresponds to a default input voltage of 1.5 V.

In some embodiments, prior to the comparing, the storage device conditions (616) the trip voltage by buffering the trip voltage and, after the buffering, level shifting and scaling the trip voltage. In some embodiments, after determining the trip voltage, an analog reference signal (e.g., DAC output 312, FIGS. 3 and 4A) corresponding to the determined trip voltage is generated by supervisory controller 124 or a component thereof (e.g., DAC 204, FIGS. 2A and 3) and input to power fail module 126 or a component thereof (e.g., $V_{dd}$ monitoring circuitry 304, FIG. 4A). Prior to comparing the reference signal (e.g., DAC output 312, FIGS. 3 and 4A) with an input signal (e.g., $V_{dd}$ 152), reference signal conditioning module 402 is configured to condition the reference signal. In some embodiments, the conditioning includes one or more of buffering, filtering, scaling, and level shifting to adjust the trip voltage so that the full range of DAC values map to the practical range of voltage trip points. For example (circuit details not shown in Figures), first, a unity gain operation amplifier buffers the reference signal (e.g., DAC output 312) to stabilize the impedance; second, a filter filters noise out of the reference signal; third, the reference signal is scaled; and fourth, the reference signal is level shifted by utilizing a voltage-supply independent voltage source (e.g., $V_{ref}$ 414).

In some embodiments, prior to comparing, the storage device conditions (618) the input voltage (e.g., $V_{dd}$ 152 or $V_{SPD}$ 156) by scaling the input voltage and filtering the input voltage. Prior to comparing the reference signal (e.g., DAC output 312 or $V_{ref}$ 414) with the input signal (e.g., $V_{dd}$ 152 or $V_{SPD}$ 156), power fail module 126 or a component thereof conditions the input signal by scaling and filtering the input signal. For example, in FIG. 4A, $V_{dd}$ 152 (e.g., the input signal) is conditioned by input signal conditioning module 404. In this example, $V_{dd}$ 152 is scaled by voltage divider circuitry and noise is filtered out of $V_{dd}$ 152 with a low-pass (e.g., RC) filter (circuit details not shown in Figures). In another example, in FIG. 4B, $V_{SPD}$ 156 (e.g., the input signal) is conditioned by input signal conditioning module 424. In this example, $V_{SPD}$ 156 is scaled down to the value of $V_{ref}$ 414 and noise is filtered out of $V_{SPD}$ 156 with a low-pass (e.g., RC) filter.

The storage device compares (620) the trip voltage to an input voltage. For example, in FIG. 4A, comparator 306 performs a comparison operation between the conditioned reference signal (e.g., the output of reference signal conditioning module 402) and the conditioned input signal (e.g., the output of input signal conditioning module 404).

The storage device triggers (622) the power fail condition in accordance with a determination that the input voltage is less than the trip voltage. For example, in FIG. 4A, if the conditioned input signal is less than the conditioned reference signal, comparator 406 is configured to output PFAIL signal 314 to supervisory controller 124 (e.g., logic high). In this example, in FIG. 4A, PFAIL signal 314 indicates the occurrence of a power fail condition (e.g., an under voltage event) as to $V_{dd}$ 152. For example, in response to receiving PFAIL signal 314 from comparator 406 indicating the power fail condition as to $V_{dd}$ 152, supervisory controller 124 or a component thereof (e.g., processor 202) is configured to perform one or more operations of a power fail process including signaling the power fail condition to a plurality of controllers on storage device 120 (e.g., storage controller 128 and NVM controllers 130, FIG. 1) via control lines 162, controlling transistors 502, 504 so that $V_{switched}$ 160 is the voltage from energy storage device 510.

In another example, in response to detecting a power fail condition (e.g., an under or over voltage event) as to $V_{dd}$ 152, $V_{dd}$ Monitoring Circuitry 304 or a component thereof (e.g., comparator 406) asserts output PFAIL signal 314 to the plurality of controllers in storage device 120 (e.g., storage controller 128 and NVM controllers 130, FIG. 1). Continuing with this example, $V_{dd}$ Monitoring Circuitry 304 also controls transistors 502, 504 so that $V_{switched}$ 160 is the voltage from energy storage device 510. In this example, $V_{dd}$ Monitoring Circuitry 304 directly asserts the PFAIL signal so as to reduce the latency of the PFAIL transition which provides power to the controllers via energy storage device 510.

In some embodiments, the trip voltage is a first trip voltage and the input voltage is a supply voltage provided by the host system, the storage device compares (624) a second trip voltage to a serial presence detect (SPD) voltage provided by the host system, and, in accordance with a determination that the SPD voltage is less than the second trip voltage, the storage device triggers the power fail condition. In some embodiments, the second trip voltage is not determined because $V_{SPD}$ is a standardized value (e.g., 3.3 V). For example, in FIG. 4B, comparator 426 performs a comparison operation between the conditioned reference signal (e.g., the output of reference signal conditioning module 422) and the conditioned input signal (e.g., the output of input signal conditioning module 424). In this example, in FIG. 4B, if the conditioned input signal is less than the conditioned reference signal, comparator 426 is configured to output PFAIL signal 314 to supervisory controller 124 (e.g., logic high). In this example, in FIG. 4B, PFAIL signal 314 indicates the occurrence of a power fail condition as to $V_{SPD}$ 156. For example, optionally, in some circumstances, in response to receiving PFAIL signal 314 from comparator 426 indicating the power fail condition as to $V_{SPD}$ 156, supervisory controller 124 or a component thereof (e.g., processor 202) is configured to perform one or more operations of a power fail process including signaling the power fail condition to a plurality of controllers on storage device 120 (e.g., storage controller 128 and NVM controllers 130, FIG. 1) via control lines 162 and causing back up power to be provided to supervisory controller 124 (e.g., $V_{switched}$ 160 via keeper circuitry 512, as shown in FIG. 5).

In another example, in response to detecting a power fail condition (e.g., an under or over voltage event) as to $V_{SPD}$ 156, $V_{SPD}$ Monitoring Circuitry 306 or a component thereof (e.g., comparator 426) asserts output PFAIL signal 314 to the plurality of controllers in storage device 120 (e.g., storage controller 128 and NVM controllers 130, FIG. 1). Continuing with this example, $V_{SPD}$ Monitoring Circuitry 306 also controls transistors 502, 504 so that $V_{switched}$ 160 is the voltage from energy storage device 510. In this example, $V_{SPD}$ Monitoring Circuitry 306 directly asserts the PFAIL signal so as to reduce the latency of the PFAIL transition which provides power to the controllers via energy storage device 510.

In some embodiments, comparing the second trip voltage to the SPD voltage provided by the host system includes comparing (626) a voltage-supply independent voltage with a voltage derived from the SPD voltage. For example, $V_{ref}$ 414 is a voltage-supply independent voltage provided by comparator 406, as shown in FIG. 4A. For example, in FIG. 4B, comparator 426 compares $V_{ref}$ 414 with a scaled version of $V_{SPD}$ 156. In this example, if $V_{ref}$ 414 is 1.23 V and the target voltage for $V_{SPD}$ 156 is 3.3 V, input signal conditioning module 424 is configured to scale down $V_{SPD}$ 156 (e.g., by approximately 73% or a factor of 2.7).

In some embodiments, the storage device provides (628) hysteresis with respect to subsequent comparisons using feedback of the comparison of the trip voltage with the input voltage. For example, in FIG. 4A, comparator 406 is configured to provide hysteresis 410 of the result of the comparison operation of DAC output 312 and $V_{dd}$ 152 for subsequent comparisons (e.g., 3 to 10 mV of feedback). In another example, in FIG. 4B, comparator 426 is configured to provide hysteresis 428 of the result of the comparison operation of $V_{ref}$ 414 and $V_{SPD}$ 156 for subsequent comparisons.

In some embodiments, the storage device latches (630) the power fail condition. For example, in FIG. 4A, when comparator 406 indicates the occurrence of a power fail condition as to $V_{dd}$ 152, PFAIL signal 314 (e.g., logic high) is provided to latching mechanism 412. In this example, PFAIL signal 314 enables transistor 408 (closed state) which shorts the input signal (e.g., $V_{dd}$ 152) to ground and, in turn, latches the power fail condition.

In some embodiments, after latching the power fail condition and completion of a power fail process, the storage device clears (632) the latched power fail condition. In some embodiments, supervisory controller 124 or a component thereof (e.g., latching module 228, FIG. 2A) is configured to unlatch the power condition upon completion of the power fail process by providing a PFAIL control signal 316 (e.g., logic low) that disables transistor 408 (open state) which opens the circuit from $V_{dd}$ 152 to ground and, in turn, unlatches the power fail condition. In some embodiments, the power fail process is complete once the plurality of controllers (e.g., storage controller 128 and NVM controller 130, FIG. 1) has transferred data held in volatile memory to non-volatile memory.

In some embodiments, the storage device triggers (634) the power fail condition in accordance with a condition determined by execution of one or more procedures by a controller within the storage device. In some embodiments, supervisory controller 124 or a component thereof (e.g., latching module 228, FIG. 2A) is configured to force the power fail condition by providing PFAIL control signal 316 (e.g., logic high) that enables transistor 408 (closed state) which shorts the input signal (e.g., $V_{dd}$ 152) to ground and, in turn, forces the power fail condition to occur. For example, the forced or simulated power fail condition is utilized to test one or more operations of the power fail process.

In some embodiments, the storage device modifies (636) one of a plurality of stored predefined trip voltages in response to a command from the host system. In some embodiments, supervisory controller 124 or a component thereof (e.g., modification module 222, FIG. 2A) is configured to modify one or more trip voltages stored in trip voltage table 220 in response to a request or command from the host system (e.g., computer system 110). In some embodiments, supervisory controller 124 is configured to receive commands (or requests) from the host system (e.g., computer system 110) via SPD bus 154. In some embodiments, storage device 120 includes a data controller coupled between host interface 122 and storage controller 128 that is configured to control the input and output of data to the one or more NVM devices. For example, the data controller is configured to receive commands (or requests) from the host system (e.g., computer system 110) and communicate the command to supervisory controller 124 (e.g., via a semaphore register or I²C).

It will be understood that, although the terms "first," "second," etc. may be used herein to describe various elements, these elements should not be limited by these terms. These terms are only used to distinguish one element from another. For example, a first NVM controller could be termed a second NVM controller, and, similarly, a second NVM controller could be termed a first NVM controller, without changing the meaning of the description, so long as all occurrences of the "first NVM controller" are renamed consistently and all occurrences of the "second NVM controller" are renamed consistently. The first NVM controller and the second NVM controller are both NVM controllers, but they are not the same NVM controller.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A method of triggering a power fail condition in a storage device operatively coupled with a host system, comprising:
within the storage device:
obtaining one or more configuration parameters, the one or more configuration parameters including an indication of a default input voltage;
accessing a table of predefined trip voltages;
based on the one or more configuration parameters and the table of predefined trip voltages, determining a first trip voltage;
comparing the first trip voltage with an input voltage; and
in accordance with a determination that the input voltage is less than the first trip voltage, triggering the power fail condition.

2. The method of claim 1, wherein the input voltage is a supply voltage provided by the host system, the method further comprising:
comparing a second trip voltage to a serial presence detect (SPD) voltage provided by the host system, wherein the SPD voltage is distinct from the supply voltage provided by the host system; and
in accordance with a determination that the SPD voltage is less than the second trip voltage, triggering the power fail condition.

3. The method of claim 2, wherein comparing the second trip voltage to the SPD voltage provided by the host system includes comparing a voltage-supply independent voltage with a voltage derived from the SPD voltage.

4. The method of claim 1, wherein the one or more configuration parameters include configuration information of the storage device.

5. The method of claim 1, wherein information identifying the default input voltage is obtained from the host system.

6. The method of claim 1, further comprising:
sampling the input voltage to determine the default input voltage.

7. The method of claim 1, further comprising:
based on the one or more configuration parameters, modifying one or more timing parameters associated with a communication bus that operatively couples the storage device and the host system.

8. The method of claim 1, wherein determining the first trip voltage includes:
selecting one of a plurality of predefined trip voltages from the table of predefined trip voltage as the first trip voltage based on the one or more configuration parameters.

9. The method of claim 1, further comprising:
in response to a modification command from the host system, modifying a predefined trip voltage within the table of predefined trip voltages.

10. The method of claim 1, further comprising:
prior to the comparing, conditioning the first trip voltage including:
buffering the first trip voltage; and after the buffering, level shifting and scaling the first trip voltage.

11. The method of claim 1, further comprising:
prior to the comparing, conditioning the input voltage including:
scaling the input voltage; and
filtering the input voltage.

12. The method of claim 1, further comprising:
providing hysteresis with respect to subsequent comparisons using feedback of the comparison of the first trip voltage with the input voltage.

13. The method of claim 1, further comprising:
latching the power fail condition.

14. The method of claim 13, further comprising:
after latching the power fail condition and completion of a power fail process, clearing the latched power fail condition.

15. The method of claim 1, further comprising:
triggering the power fail condition in accordance with a condition determined by execution of one or more procedures by a controller within the storage device.

16. A storage device, comprising:
an interface for operatively coupling the storage device with a host system;
a supervisory controller with one or more processors and memory;
a power fail module for detecting a power fail condition; and
a plurality of controllers for managing one or more non-volatile memory devices, the storage device configured to:
obtain one or more configuration parameters, the one or more configuration parameters including an indication of a default input voltage;
access a table of predefined trip voltages;
based on the one or more configuration parameters and the table of predefined trip voltages, determine a first trip voltage;
compare the first trip voltage with an input voltage; and
in accordance with a determination that the input voltage is less than the first trip voltage, trigger the power fail condition.

17. The storage device of claim 16, wherein the input voltage is a supply voltage provided by the host system, and the storage device is further configured to:
compare a second trip voltage to a serial presence detect (SPD) voltage provided by the host system, wherein the SPD voltage is distinct from the supply voltage provided by the host system
in accordance with a determination that the SPD voltage is less than the second trip voltage, trigger the power fail condition.

18. The storage device of claim 17, wherein comparing the second trip voltage to the SPD voltage provided by the host system includes comparing a voltage-supply independent voltage with a voltage derived from the SPD voltage.

19. The storage device of claim 16, wherein the one or more configuration parameters include configuration information of the storage device.

20. A non-transitory computer readable storage medium, storing one or more programs for execution by one or more processors of a storage device, the one or more programs including instructions that when executed by the one or more processors cause the storage device to:
obtain one or more configuration parameters, the one or more configuration parameters including an indication of a default input voltage;
access a table of predefined trip voltages;
based on the one or more configuration parameters and the table of predefined trip voltages, determine a first trip voltage;
compare the first trip voltage with an input voltage; and
in accordance with a determination that the input voltage is less than the first trip voltage, trigger the power fail condition.

21. The non-transitory computer readable storage medium of claim 20, wherein the input voltage is a supply voltage provided by the host system, and the one or more programs further include instructions, that when executed by the one or more processors cause the storage device to:
compare a second trip voltage to a serial presence detect (SPD) voltage provided by the host system, wherein the SPD voltage is distinct from the supply voltage provided by the host system; and
in accordance with a determination that the SPD voltage is less than the second trip voltage, trigger the power fail condition.

22. The non-transitory computer readable storage medium of claim 21, wherein comparing the second trip voltage to the SPD voltage provided by the host system includes comparing a voltage-supply independent voltage with a voltage derived from the SPD voltage.

23. The non-transitory computer readable storage medium of claim 20, wherein the one or more configuration parameters include configuration information of the storage device.

* * * * *